(12) United States Patent
Xu et al.

(10) Patent No.: US 8,271,213 B2
(45) Date of Patent: Sep. 18, 2012

(54) ONLINE PARTIAL DISCHARGE MONITORING SYSTEM OF GENERATOR AND METHOD THEREOF

(75) Inventors: Yang Xu, Xi'an (CN); Xiao Hu, Xi'an (CN); Yuan La, Guangzhou (CN); Zhengping Zhang, Guangzhou (CN); Chuming Yang, Guangzhou (CN)

(73) Assignees: Xi'an Jiaotong University, Guangzhou, Guangdong Province (CN); Guangdong Power Test & Research Institute of Guangdong Province, Guangzhou, Guangdong Province (CN)

( * ) Notice: Subject to any disclaimer, the term of this patent is extended or adjusted under 35 U.S.C. 154(b) by 332 days.

(21) Appl. No.: 12/667,517

(22) PCT Filed: Jun. 16, 2008

(86) PCT No.: PCT/CN2008/001167
§ 371 (c)(1),
(2), (4) Date: May 11, 2010

(87) PCT Pub. No.: WO2009/003361
PCT Pub. Date: Jan. 8, 2009

(65) Prior Publication Data
US 2010/0241372 A1    Sep. 23, 2010

(30) Foreign Application Priority Data
Jul. 3, 2007    (CN) .......................... 2007 1 0018186

(51) Int. Cl.
*G01R 31/02*    (2006.01)
*G01R 31/34*    (2006.01)
*G06F 19/00*    (2006.01)

(52) U.S. Cl. ............................. 702/58; 702/59; 702/107

(58) Field of Classification Search .................. 702/58, 702/59, 72, 76, 107; 324/525, 529, 536, 324/601
See application file for complete search history.

(56) References Cited

U.S. PATENT DOCUMENTS
6,345,236 B1    2/2002    Bertheau
(Continued)

FOREIGN PATENT DOCUMENTS
CN    1329253    1/2002
(Continued)

OTHER PUBLICATIONS

Written Opinion of the International Searching Authority dated Aug. 12, 2008, PCT Patent Application No. PCT/CN2008/001167, filed Jun. 16, 2008.

(Continued)

*Primary Examiner* — John H Le
(74) *Attorney, Agent, or Firm* — Vierra Magen Marcus & DeNiro LLP

(57) ABSTRACT

A system and method for online monitoring partial discharge of a generator are disclosed. The system is connected in parallel with a busbar between the generator and electric network, includes: a near-end circuit on a generator side, which includes a near-end capacitive coupling sensor connected to the busbar and a near-end impedor connected in series with the near-end capacitive coupling sensor; a far-end circuit on an electric network side, which includes a far-end capacitive coupling sensor connected to the busbar and a far-end impedor connected in series with the far-end capacitive coupling sensor; and a detection device, which has a near-end input terminal connected to a connection point between the near-end capacitive coupling sensor and the near-end impedor through a near-end cable, a far-end input terminal connected to a connection point between the far-end capacitive coupling sensor and the far-end impedor through a far-end cable, and a processing unit.

22 Claims, 13 Drawing Sheets

U.S. PATENT DOCUMENTS 8,126,664 B2 * 2/2012 Fournier et al. .............. 702/59

FOREIGN PATENT DOCUMENTS

| CN | 1420361 | 5/2003 |
| --- | --- | --- |
| CN | 2758782 | 2/2006 |
| CN | 1777814 | 5/2006 |
| CN | 101086515 | 12/2007 |
| JP | 2006133073 | 5/2006 |
| JP | 2006138687 | 6/2006 |
| WO | WO2009003361 | 1/2009 |

OTHER PUBLICATIONS

International Search Report dated Aug. 28, 2008, PCT Patent Application No. PCT/CN2008/001167, filed Jun. 16, 2008.

International Preliminary Report on Patentability dated Sep. 25, 2009, PCT Patent Application No. PCT/CN2008/001167, filed Jun. 16, 2008.

English Translation of Abstract of Chinese Patent CN1329253, published Jan. 2, 2002.

English Translation of Abstract of Chinese Patent CN2758782, published Feb. 15, 2006.

English Translation of Abstract of Chinese Patent CN1777814, published May 24, 2006.

English Translation of Abstract of Chinese Patent CN101086515, published Dec. 12, 2007.

English Translation of Abstract of Japanese Patent JP2006138687, published Jun. 1, 2006.

English Translation of Abstract of Japanese Patent JP2006133073, published May 25, 2006.

Feng, "Noise Rejection for Partial Discharge Measurement of Hydro Generators," High Voltage Engineering, vol. 30, No. 1, Jan. 2004, pp. 26-27, with English Translation of Abstract.

La, "A Novel Approach for Noise Rejection Applied in Online Partial Discharge Monitoring of Generators," High Voltage Apparatus, vol. 41, No. 1, Feb. 2005, pp. 16-17, with English Translation of Abstract.

Liu, "Partial Discharge Monitoring Technology of Generator Stator Winding," Hebei Electric Power, vol. 26, No. 1, Feb. 2007, pp. 8-9, with English Translation of Abstract.

Liu, "Application of PD Monitoring System in bulb Flow-type Generator," High Voltage Engineering, vol. 33, No. 1, Jan. 2007, pp. 160-164, with English Translation of Abstract.

English Translation of portions of Feng, "Noise Rejection for Partial Discharge Measurement of Hydro Generators," High Voltage Engineering, vol. 30, No. 1, Jan. 2004, pp. 26-27.

English Translation of portions of La, "A Novel Approach for Noise Rejection Applied in Online Partial Discharge Monitoring of Generators," High Voltage Apparatus, vol. 41, No. 1, Feb. 2005, pp. 16-17.

English Translation of portions of Chinese Patent CN1420361A, Publication Date: May 28, 2003.

Examination Report of Chinese Patent Application 200710018186.3.

English Translation of Examination Report, dated Apr. 4, 2008 for Chinese Patent Application 200710018186.3.

\* cited by examiner a)

b)    c)

a)

b)                                                            c)

a)

b)

a)

b)

c)

US 8,271,213 B2

ONLINE PARTIAL DISCHARGE MONITORING SYSTEM OF GENERATOR AND METHOD THEREOF

FIELD OF THE INVENTION

The present invention relates to a system and method for online monitoring partial discharge of a generator, and in particular to a system and method for online monitoring partial discharge of a generator based on directional coupling of dual sensors.

DESCRIPTION OF RELATED ART

Safe operation of a generator is a precondition for supplying power with a guaranteed quality, and a major part of failures for a generator is due to insulation failures, therefore, online monitoring of insulation conditions has become one of leading-edge hot topics in the electric engineering field.

The insulation conditions can be characterized by various characteristic parameters, in which partial discharge (PD) is the most common and sensitive premonitory feature of insulation failures. Various insulation defects, such as, delamination, crazing, looseness, aging of semiconductor layers, dropping-out, contamination of high-voltage end, damping, wire breaking in a winding, poor contact of connectors, aging and embrittlement of insulation layers, or the like, will result in the PD, which in turn enlarges the defects, so that a vicious circle is formed and insulation aging is accelerated. Therefore, people have paid most attentions to online monitoring of the PD among various online monitoring technologies for the insulation conditions of a generator.

The most serious problem faced when implementing online monitoring of partial discharge of a generator is noise interference, and generally, it is believed that there are three noise interference sources affecting the measurement of partial discharge:

a. external noises from an electric power system, which are introduced by an output line of the generator. These noise signals may be generated by discharging inside other electrical devices in the electric power system, or may be disordered interferences which are coupled in from outside by a power transmission line.

b. high-frequency interferences from direct-current excitation of a rotor, which are coupled in by capacitors and inductors. These interference noises may originate from a thyristor for excitation, an axial potential, or arcs of electrical brushes, or may be interference noises generated by other devices in an electric power plant, which are transmitted through a brush end.

c. external interferences which are introduced by housing coupling of a stator of the generator. Although the housing of the stator of the generator has a grounding point, it is not an equipotential body, therefore external interference signals can be transmitted to windings of the stator via the housing and a core.

These interferences will be transmitted to a test system via space, and busbars and ground wires of an electric network system. Because PD signals are very weak and are quite broadly distributed in the frequency domain, any successful online monitoring technique has to be able to remove or suppress these interferences so as to make them much less than the PD signals, so that the real PD signals are reliably extracted from a background of strong noises. This is a critical technical problem that people have been striving to overcome in these years.

Since 1950s, much fundamental research and application development work has been performed for online monitoring partial discharge of a large-scale generator, and currently a plurality of methods have been applied in practical projects. The methods for online monitoring partial discharge of a large-scale generator mainly include a neutral-point-coupling monitoring method, a radio-frequency monitoring method, a PDA monitoring method, and a stator-slot coupling method. Since the structure of windings of a stator of a turbo generator is different from that of a generator, the stator-slot coupling method is often applied to the turbo generator. Currently, the PDA monitoring method is mainly used to online monitor partial discharge of the generator. The above online monitoring methods have different noise suppression effects for different noise sources. For example, the PDA monitoring method has the best suppression effect for the first kind of noises, and a portable capacitive coupling monitoring method has a good discrimination capability and suppression effect for the second and third kinds of noises. However, generally speaking, current techniques for online monitoring partial discharge of a generator have disadvantages of low sampling frequencies for discharge signals, poor anti-interference effects, and the like, thus it is difficult to obtain a desirable effect of monitoring partial discharge.

Accordingly, there is a need for a system and a method for monitoring partial discharge of a generator, which can effectively measure real partial discharge signals from internal of the generator.

SUMMARY OF THE INVENTION

The present invention is made in view of the above problems in the prior art. The present invention aims at providing a system and a method for online monitoring partial discharge of a generator, which are based on directional coupling of dual sensors, remove or suppress interferences by using software to perform discriminations of time delay and amplitude, and can effectively measure real partial discharge signals from internal of the generator, so as to provide an effective reference for evaluating insulation conditions inside the generator.

According to an aspect of the present invention, there is provided a system for monitoring partial discharge, which is connected in parallel with a busbar between a generator and an electric network, and the system for monitoring partial discharge comprises: a near-end circuit on a generator side, which includes a near-end capacitive coupling sensor connected to the busbar and a near-end impedor connected in series with the near-end capacitive coupling sensor; a far-end circuit on an electric network side, which includes a far-end capacitive coupling sensor connected to the busbar and a far-end impedor connected in series with the far-end capacitive coupling sensor; and a detection device, which has a near-end input terminal connected to a connection point between the near-end capacitive coupling sensor and the near-end impedor through a near-end cable, a far-end input terminal connected to a connection point between the far-end capacitive coupling sensor and the far-end impedor through a far-end cable, and a processing unit, wherein a length L of the busbar between the two capacitive coupling sensors, a length L1 of the near-end cable, and a length L2 of the far-end cable satisfy $$\frac{L}{V_b} + \frac{L_1}{V_c} = \frac{L_2}{V_c},$$

in which $V_b$ is a transmission speed of a signal in the busbar and $V_c$ is a transmission speed of a signal in the cables. The processing unit selects one pulse from each of a near-end signal input from the near-end input terminal and a far-end signal input from the far-end input terminal as a first comparison pulse and a second comparison pulse according to amplitudes of pulses in the near-end signal and the far-end signal, and discriminates a partial discharge signal according to a comparison between a preset time delay threshold and a time delay between the first comparison pulse and the second comparison pulse.

According to another aspect of the present invention, there is provided a method for monitoring partial discharge using the above-described system for monitoring partial discharge, and the method comprises: receiving a near-end signal from the near-end input terminal and receiving a far-end signal from the far-end input terminal; selecting one pulse respectively from the near-end signal and the far-end signal as a first comparison pulse and a second comparison pulse according to amplitudes of pulses in the near-end signal and the far-end signal; and discriminating a partial discharge signal according to a comparison between a preset time delay threshold and a time delay between the two comparison pulses.

The system and method for monitoring partial discharge of a generator according to the present invention can effectively remove or suppress various interferences from external of the generator, measure partial discharge signals inside the generator correctly, and thereby provide an effective reference for evaluating insulation conditions inside the generator.

BRIEF DESCRIPTION OF THE DRAWINGS

The above and other objects, features, and advantages of the present invention will become more apparent from the detailed description of embodiments of the present invention in conjunction with the attached drawings, in which.

DETAILED DESCRIPTION OF THE INVENTION

Embodiments of the present invention will be described in details below with reference to the accompanying drawings. Throughout the drawings, like reference signs represent similar elements.

Various interferences can be classified into two types, i.e. narrow band (or single frequency) interferences and broad band interferences, according to their characteristics of time domain and frequency domain. The broad band interferences can be divided into periodic pulses and random pulses, the latter of which are the most difficult to be overcome and mainly come from an electric network (busbars). The present invention discriminates and eliminates this type of interferences by using a pulse time delay based on directional coupling of dual sensors. Alternatively, the present invention discriminates and eliminates this type of interferences by adopting directional coupling of dual sensors, and a pulse time delay and amplitude discriminating method, and at the same time can suppress other interferences by adopting methods, such as setting dynamic thresholds, digital filtering, phase windowing, or the like, as required.

A system for monitoring partial discharge (PD) of a generator of the present invention is firstly described below with reference to FIG. 1.

Figure 1:
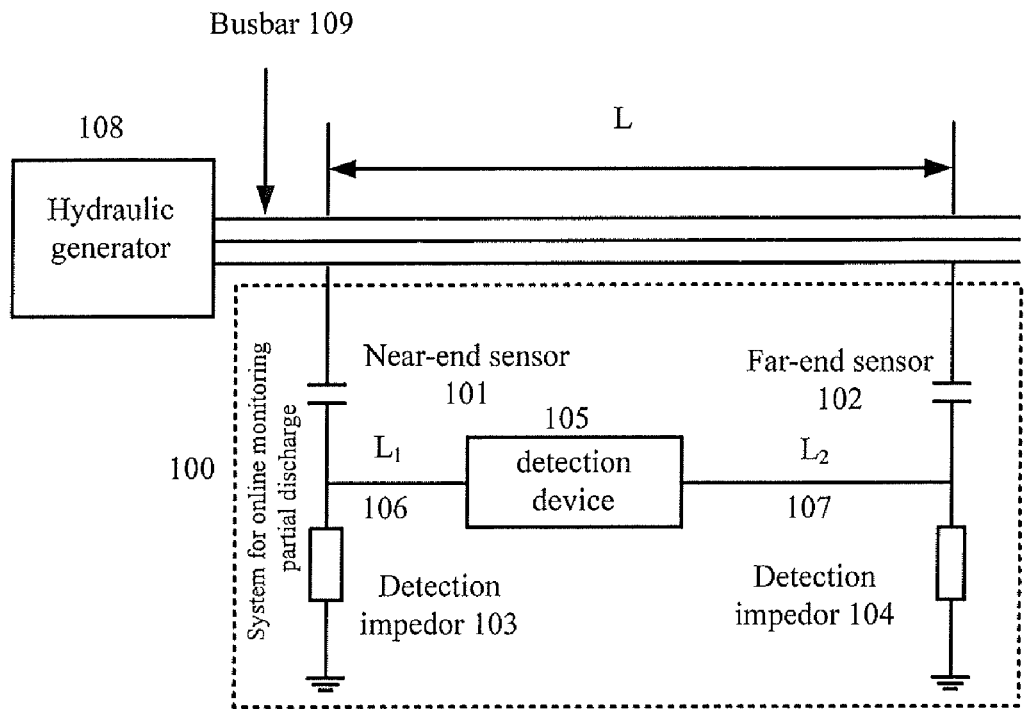
FIG. 1 is a schematic structural diagram of a system for online monitoring partial discharge according to the present invention.

As shown in FIG. 1, a system 100 for monitoring partial discharge and a busbar 109 are connected in parallel between a generator 108 and an electric network (not shown). The system 100 for monitoring partial discharge comprises: a near-end sensor 101, a far-end sensor 102, a near-end detection impedor 103, a far-end detection impedor 104, and a PD detection device 105. The near-end sensor 101 and the far-end sensor 102 are connected to the busbar in a same direction. The near-end sensor 101 is arranged at a high voltage end (near end) close to windings of the generator, the far-end sensor 102 is arranged at an end (far end) close to the electric network, and a distance between the two sensors, i.e. a length of the busbar between the two sensors, is L(m). The near-end sensor 101 is connected to ground via the detection impedor 103, and the far-end sensor 102 is connected to the ground via the detection impedor 104. The PD detection device 105 has a near-end input terminal and a far-end input terminal, in which the near-end input terminal is connected to a connection point between the near-end sensor 101 and the detection impedor 103 through a near-end signal cable 106 of a length $L_1$, and the far-end input terminal is connected to a connection point between the far-end sensor 102 and the detection impedor 104 through a far-end signal cable 107 of a length $L_2$.

The near-end sensor 101 and the far-end sensor 102 are capacitive coupling sensors, for example, high-voltage ceramic capacitive coupling sensors, which can insulate a high voltage with a power frequency, transmit very high frequency (VHF) signals, and protect the detection impedors and subsequent circuits.

Signals sent from the generator and the electric network are acquired from the detection impedor 103 and the detection impedor 104 to thereby acquire a VHF partial discharge signal mixed therein.

In the monitoring process, one pulse signal of interference pulses input from the electric network first arrives at the far-end sensor 102, and then is input to the detection device 105 (via its far-end input terminal) through the signal cable 107, and another pulse signal of the interference pulses first passes through the busbar 109 of the generator, and then is input to the detection device 105 (via its near-end input terminal) through the signal cable 106. One signal of PD pulses from the generator first arrives at the near-end sensor 101, and then is input to the detection device 105 through the signal cable 106, and another signal of the PD pulses passes through the busbar 109, and then is input to the detection device 105 through the signal cable 107. L, $L_1$, and $L_2$ are selected to satisfy:

$$\frac{L}{V_b} + \frac{L_1}{V_c} = \frac{L_2}{V_c}, \quad (1)$$

in which $V_b$ represents a transmission speed of a signal in the busbar, and $V_c$ represents a transmission speed of a signal in the signal cables. In order to obtain a better discrimination effect, L, $L_1$, and $L_2$ are preferably selected to satisfy:

$$\frac{L}{V_b} + \frac{L_1}{V_c} = \frac{L_2}{V_c} \quad (2)$$

and $$\frac{L}{V_b} + \frac{L_2}{V_c} - \frac{L_1}{V_c} > \Delta t_0,$$

in which $\Delta t_0$ is a preset time delay threshold. More preferably, if $V_c$=0.65 $V_b$, then L, $L_1$, and $L_2$ are selected to satisfy:

$$0.65L + L_1 = L_2 \quad (3)$$

and $$\frac{0.65L + L_2 - L_1}{0.65 V_b} > \Delta t_0$$

Figure 2:
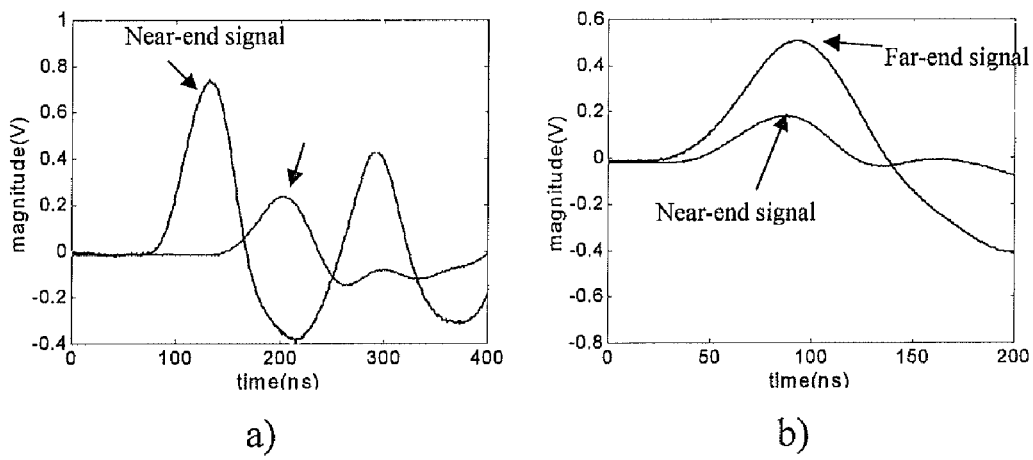
FIG. 2 is a timing chart showing that two signals of partial discharge pulses and interference pulses arrive at a detection device, in which FIG. 2a) represents the partial discharge pulses and FIG. 2b) represents the interference pulses.

That is, by setting L, $L_1$, and $L_2$ as above, the two signals of the external interference pulses are enabled to arrive at the detection device 105 substantially at the same time or with a small time difference, as shown in FIG. 2b), whereas there is a large time delay between the times at which the two signals of the partial discharge pulses are respectively input to the detection device 105, as shown in FIG. 2a).

Figure 3:
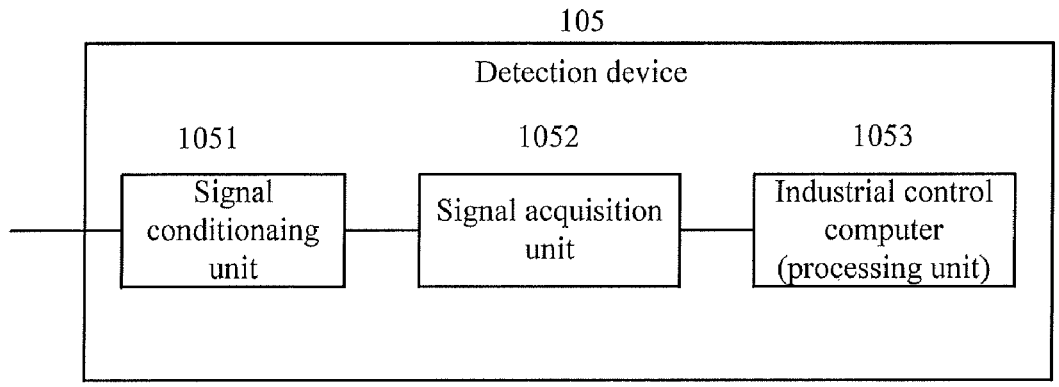
FIG. 3 is a block diagram for a detection device 105 shown in FIG. 1.

The detection device 105 is a VHF test system. It has a bandwidth of 5 MHz to 100 MHz, and thus has a good pulse response (a first wave of pulses can be discriminated). The detection device 105 is obtained by making improvements on the basis of Kai Wang, "*Research and development of a UHF online monitoring system for partial discharge of a hydraulic generator*", a thesis for pursing a master's degree in Xi'An Jiaotong University, 2003, the content of which is incorporated herein by reference. FIG. 3 shows a block diagram of the detection device 105. As shown in FIG. 3, the detection device 105 mainly comprises a signal conditioning unit 1051, a signal acquisition unit 1052, and an industrial control computer (processing unit) 1053. As described later, the detection device 105 can further comprise other auxiliary units.

Figure 4:
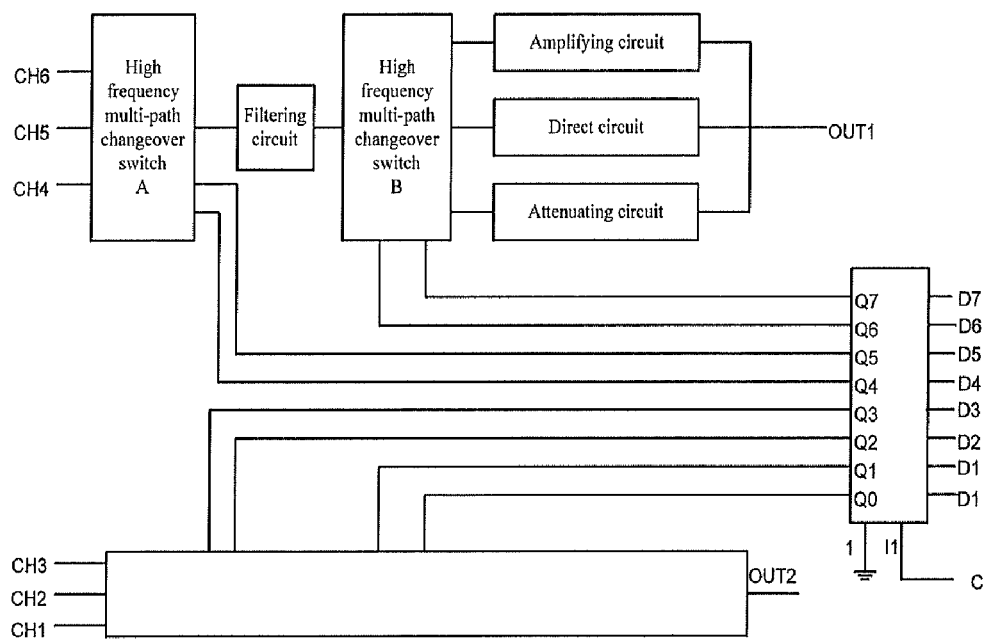
FIG. 4 is an exemplary circuit diagram showing a signal conditioning unit 1051 shown in FIG. 3.

The signal conditioning unit 1051 is a dual one-out-of-three signal conditioning circuit designed according to test requirements, and is mainly used to implement processing on voltage signals from the sensors, select different phase sequences, and select different processing manners and filtering processing. An exemplary circuit diagram of the signal conditioning unit 1051 is shown in FIG. 4. As shown in FIG. 4, the signal conditioning unit 1051 comprises high frequency changeover switches, a filtering circuit, an amplifying circuit, an attenuating circuit, and so on. The high frequency changeover switches are respectively composed of three or two groups of one-out-of-two high frequency relays with a coil voltage of 12V, a maximum switching current of 0.5 A, and a maximum switching voltage of 30V (AC or DC). The filtering circuit is a high pass filter for filtering out low frequency interferences. A cut-off frequency of 5 MHz can be selected, so that most interferences are suppressed.

The signal acquisition unit 1052 acquires the voltage signals from the signal conditioning unit, performs A/D conversion on the voltage signals, and transmits the signals subjected to the A/D conversion to the industrial control computer 1053, so that the digital voltage signals are further processed and analyzed. In an exemplary implementation, a data acquisition card of PCI-5112 type from NI Corporation of the United States is used together with a RTSI bus to build the acquisition unit which can acquire signal data in six paths in a time-sharing manner. The acquisition card can be installed in the industrial control computer to acquire data in real time and perform A/D conversion. The acquisition card adopts a PCI bus manner. Due to a high speed characteristic of the PCI bus, problems such as real time acquisition, real time transmission, real time storage, and so on are effectively solved, and a transmission bottleneck for a large amount of data is removed. Main parameters of the acquisition card are as follows: (1) two 8-bit analog input channels; (2) adopting a manner of two paths synchronized and a single end grounded; (3) an optional analog input bandwidth of 100 MHz; (4) a maximum repetitive sampling rate of 2.5 GS/s and a maximum single sampling rate of 100 MS/s; (5) a 16 MB buffer per channel; (6) optional input impedances of 50Ω and 1MΩ; (7) selecting AC/DC via software; (8) triggering manners of optional internal/external triggering and optional rising edge/falling edge triggering; (9) digital I/O parameters; (10) PCT slots built in the computer; and (11) having three digital input/output ports, each of which is composed of a 8-bit digital quantity.

The industrial control computer 1053 is a core hardware platform of the detection device 105, and is mainly used to implement the control of the whole monitoring process and the discrimination of partial discharge pulses. In particular, the industrial control computer has application software installed therein, and serves as the processing unit of the detection device 105 in combination with the application software. The processing unit controls the signal acquisition unit, the signal conditioning unit, and a power supply management unit (not shown), and implements functions of online data acquisition for a partial discharge signal, processing and storage of partial discharge data, discrimination and spectrum displaying of partial discharge, inquiry of history partial discharge conditions, and the like between a server and a client. The computer is implemented by a high performance industrial control computer, and has a stable performance, a reliable operation, and a good anti-interference capability. Meanwhile, it is equipped with a liquid crystal display, a keyboard of notebook type, and a photoelectric mouse. Of course, the processing unit can also be implemented by other computers different from the industrial control computer.

The application software installed in the industrial control computer is a program for online monitoring partial discharge of a generator, which, when executed, processes received signals to discriminate partial discharge pulses. The application software is programmed based on LabVIEW (Laboratory Virtual Instrument Engineering Workbench) which is graphic programming software from the NI Corporation of the United States, adopts a man-machine interface in a Windows-like style, has a friendly interface, is easy to operate, and is convenient to maintain. The software can further implement automatic monitoring of the partial discharge measurement process to simplify operations of operators, and users may also implement more functions such as inquiry, analysis, and the like through manual operations.

The software mainly comprises the following program modules:

Data Acquisition Program Module

The data acquisition program module is programmed using the graphic programming software LabVIEW. It is mainly used to complete hardware interface control, and can perform network acquisition control, network data transmission, anti-interference, and so on. Specifically, functions of the data acquisition program module mainly comprise: (1) cyclic data acquisition for a multi-path partial discharge signal sensor; (2) anti-interference functions, such as performing filtering (Finite Impulse Response (FIR) or Infinite Impulse Response (IIR)) on original signals, discriminating time delay, phase windowing, setting thresholds, and so on; and (3) other editing functions, such as adjusting acquisition rates, selecting acquisition channels, choosing program controlled magnification, and so on.

Figure 5:
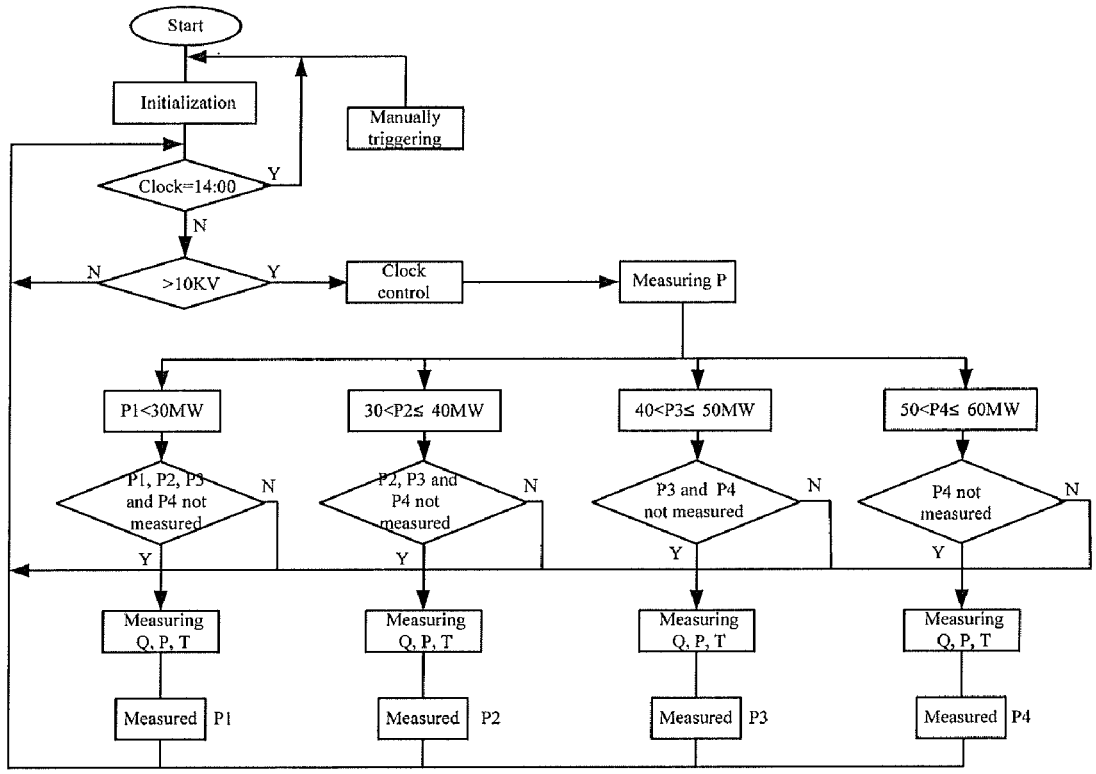
FIG. 5 is a flow diagram for measurement control of the system for monitoring partial discharge.

The acquisition program module can be classified into an automatic acquisition program module and a manual acquisition program module. The automatic acquisition program module can monitor a change in operation condition of the generator in real time, and initiate a measurement program (monitoring program) according to the change in the operation condition to discriminate whether partial discharge occurs. The detection device divides a stage from startup of the generator to full-load operation of the generator into four power intervals; when the operation condition of the generator jumps from one power interval to another power interval, the detection device monitors that the operation condition changes, checks measurement records, and starts the measurement program if there is no measurement record in this power interval, or continues to monitor the operation condition if there is a measurement record in this power interval. A flow diagram that the detection device initiates a measurement is shown in FIG. 5. For example, the system measures 50 power frequency periods (1s) each time, and displays a discharge diagram for the power frequency periods (an accumulated discharge diagram for 1s after anti-interference processing).

Data Analysis Program Module

The data analysis program module is also designed under the development platform of LabVIEW, and has a friendly interface. Main functions of the data analysis program module are as follows: (1) detecting parameters such as a discharging amplitude (Qm), a discharging phase, a number of times of discharging, polarity, a total amount of discharging (NQN), and so on; (2) displaying a N-Q diagram, a Q-$\phi$ diagram, a N-$\phi$ two dimensional spectrum, a N-Q-$\phi$ three dimensional spectrum, and so on; (3) selecting a discharging trend diagram for an interval and inquiring history partial discharge data; and (4) performing pre-warning and warning for failures due to partial discharge. The above-described important spectrums can be obtained through program analysis after reading data, and these spectrums have important reference value for qualitative analysis of partial discharge and insulation diagnosis.

Database Program Module

The module is a database for storing partial discharge data which is constructed with for example Microsoft SQL Server, can conveniently implement a data server/client structure, and can be upgraded for network transmission of data. The database can be stored in a commonly known memory (not shown). The database program module associates program modules for acquisition of partial discharge signals, diagnosis, and inquiry with each other, and is hidden from common users, i.e., only users possessing a high level management authority can perform data operations on the database program module. Three types of data are stored in the database: (1) real-time partial discharge data and preprocessed data for generating various spectrums of partial discharge; (2) history partial discharge data information and typical partial discharge mode data information, according to which a partial discharge trend diagram can be generated and inquiry of related parameters of history partial discharge can be realized; and (3) partial discharge information exceeding a partial discharge alert value or related history data when an accident occurs, which are used for tracking, displaying and inquiring partial discharge data.

Figure 6:
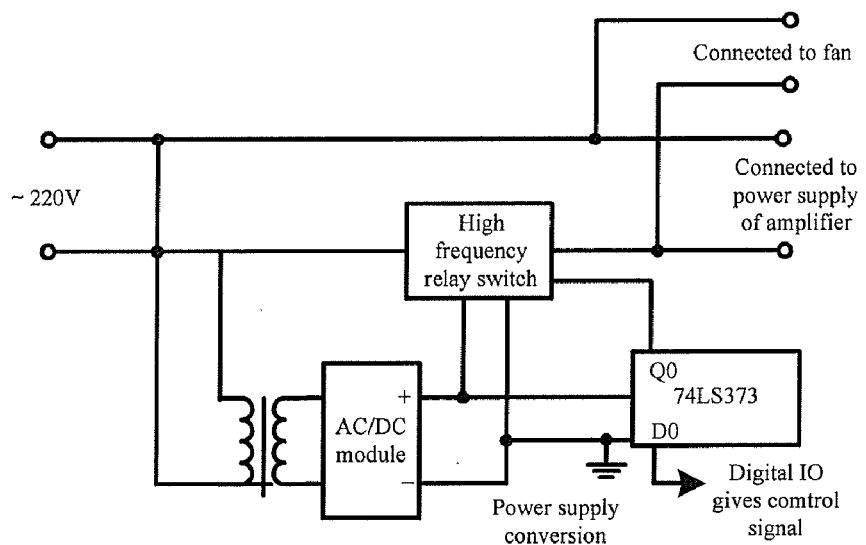
FIG. 6 shows an exemplary circuit diagram for a power supply management unit according to the present invention.

Further, the detection device 105 according to the present invention may further comprise other auxiliary units (not shown), for example, a phase information extracting unit for extracting discharging phase information, a self-test unit for a self-test of the measurement system, and a power supply control unit. For partial discharge information, a phase of a power-frequency voltage to which the time at which the discharge occurs corresponds, besides the amplitude thereof, is also important information. Therefore, the phase information extracting unit extracts the power-frequency voltage from a PT (voltage mutual inductor), insulates and divides the power-frequency voltage, and then converts it into zero-crossing pulses and transmits the zero-crossing pulses to the acquisition card as a triggering signal for acquiring discharge signals. The self-test unit checks whether the detection device can work normally. The self-test unit inputs a sharp pulse signal generated inside the unit into an input terminal of the detection device to replace the partial discharge signal. If the detection device has a normal reaction, then it can be put into actual measurement. The power supply control unit is used to guarantee stableness of a power supply, which is very important for guaranteeing a normal operation of the whole system. FIG. 6 shows an exemplary circuit diagram of the power supply control unit, in which on/off of the power supply is controlled by using a digital I/O card. Hereinafter, the process in which the detection device 105 detects discharge pulses will be described in more detail.

After L, $L_1$, and $L_2$ are set according to the equation (1), (2), or (3), two signals external interference pulses from the electric network pass through the near-end and far-end sensors and the signal cables respectively, and the two signals would arrive at the detection device 105 substantially at the same time or with a small time difference, whereas the time difference between the times at which two signals of partial discharge pulses from internal of the generator arrive at the detection device 105 would be greater than the preset time delay threshold $\Delta t_0$. Therefore, the partial discharge pulses and the external interference pulses can be differentiated based on this principle. The detection device has a very broad frequency band, and the detection of the time delay can be up to an order of nanosecond (ns). The reference value $\Delta t_0$ can be selected experimentally. Alternatively, L, $L_1$, $L_2$, and $\Delta t_0$ are estimated theoretically, and then their best values are determined according to filed measurements.

In the monitoring, the signal conditioning unit 1051 receives two signal sequences, i.e., a near-end signal sequence and a far-end signal sequence, via the near-end input terminal and the far-end input terminal, and partial discharge pulses (if any) and external interference pulses have been mixed in each of the signal sequences. The signal conditioning unit 1051 filters the two signal sequences by using a high pass filter and selecting a cut-off frequency of 5 MHz so as to suppress most interferences which are relatively serious at low frequencies, and provides the filtered signal sequences to the signal acquisition unit 1052.

The signal acquisition unit 1052 acquires the filtered signal sequences from the signal conditioning unit 1051, performs A/D conversion on them, and transmits the converted digital signal sequences to the processing unit 1053. For example, signals of one power frequency period can be continuously and simultaneously acquired each time through two channels (the near end and the far end) of the signal acquisition unit respectively, and then A/D conversion is performed on the signals.

The processing unit 1053 receives the two signal sequences subjected to the A/D conversion from the signal acquisition unit 1052. Preferably, the processing unit 1053 firstly performs digital filtering on the two received digital signal sequences respectively to filter out certain fixed high frequency interferences, because the signal acquisition unit 1052 acquires a large amount of signal data. The method for digital filtering is well known in the art, thus detailed description thereof is omitted here for simplicity. Then, the processing unit 1053 performs dynamic threshold processing respectively on the two signal sequences subjected to the digital filtering. The dynamic threshold processing may determine and set a dynamic threshold according to a level of background noises. The processing unit 1053 reads the dynamic threshold, compares amplitudes of signals in the signal sequences subjected to the digital filtering with the dynamic threshold respectively, and filters out signals whose amplitudes are smaller than the dynamic threshold, so as to further reduce the amount of data to be processed.

Next, the processing unit 1053 finds a first pulse having an amplitude greater than the dynamic threshold in the near-end signal sequence, intercepts in the near-end signal sequence a segment of data (referred to as a near-end data segment below) afterwards by using the first pulse as a starting signal point, and intercepts in the far-end signal sequence a segment of data (referred to as a far-end data segment below) having the same length as the near-end data segment afterwards from the time which is the same as the starting signal point. The lengths of the near-end and far-end data segments determine a pulse resolution of the system, and can be changed by changing the pulse resolution of the system. However, the lengths are determinate for a system whose pulse resolution has been determined.

Then, the processing unit 1053 selects one pulses from each of the near-end data segment and the far-end data segment, and the two pulses are used as pulses for time delay comparison (i.e. comparison pulses). In the process of actual measurement, the value of the set time delay threshold usually ranges from 40 ns to 70 ns. Since a time period for which one measurement lasts is usually 20 ms, and occurrence of the interference pulses or the discharge pulses in the measurement time period is random, the probability that the interference pulses or other discharge pulses occur in a short time period to which the time delay threshold corresponds is extremely small. For external interference pulses, since the time delay between the times at which two signals thereof arrive at the detection device 105 is small (usually 10 to 20 ns), it is substantially impossible for other pulses to occur in this time period as compared with the time period for one measurement of 20 ms. Therefore, the processing unit 1053 can select pulses having the largest amplitudes from the near-end data segment and the far-end data segment respectively as the pulses for time delay comparison, calculate the time delay between the two pulses, i.e. the time difference between the times at which the two pulses enter the detection device 105, and compares the time delay with the preset time delay threshold $\Delta t_0$. If the time delay is greater than $\Delta t_0$, it is determined that the two pulses belong to partial discharge pulses, while if the time delay is less than $\Delta t_0$, it is determined that the two pulses belong to external interference pulses.

However, measurement experience shows that a first wave (i.e., a first pulse) and a second wave (i.e., a second pulse) of oscillating waveforms obtained after the near-end signal sequence and the far-end signal sequence pass through similar loops most likely to have correspondence, and subsequent portions of the oscillating waveforms often cannot reflect true characteristics of the original signals well due to resonance of the loops. Therefore, preferably, the processing unit 1053 firstly judges whether an amplitude of the first wave in the near-end data segment (the near-end first wave) is the largest, and if so, determines the near-end first wave and a first wave in the far-end data segment (a far-end first wave) as the pulses for time delay comparison. On the other hand, if it is not, the processing unit 1053 judges whether an amplitude of a second wave in the near-end data segment (a near-end second wave) is the largest, and if so, determines the near-end second wave and a second wave in the far-end data segment (a far-end second wave) as the pulses for time delay comparison. On the other hand, if it is not, the processing unit 1053 selects one pulse having the largest amplitude in the near-end data segment and one pulse having the largest amplitude in the far-end data segment as the pulses for time delay comparison. Subsequently, the processing unit 1053 calculates the time delay between the two determined pulses, and discriminates the partial discharge pulses from the external interference pulses by the comparison with the preset time delay threshold $\Delta t_o$ in the above-described manner.

Alternatively, in order to improve reliability of the result of the discrimination, the processing unit 1053 may additionally discriminate the partial discharge pulses through amplitude discrimination. As is well known in the art, VHF signals are attenuated greatly during transmission. For the partial discharge pulses from the generator, the near-end transmission distance is much shorter than the far-end transmission distance, thus the amplitude of the branch signal of the partial discharge pulses which enters the detection device 105 from the near-end input terminal is much greater than the amplitude of the branch signal of the partial discharge pulses which enters the detection device 105 from the far-end input terminal, as shown in FIG. 2a). For the external interference pulses, the transmission distance of the branch signal thereof entering the detection device 105 via the near-end input terminal is close to that of the branch signal thereof entering the detection device 105 via the far-end input terminal, thus the difference between the amplitudes of the two branch signals is small, as shown in FIG. 2b). Therefore, in addition to the above-described time delay comparison, the processing unit 1053 further calculates the amplitude difference of the two pulses determined for time delay comparison, and compares the amplitude difference with a preset amplitude difference threshold. When the time delay between the two pulses is greater than the time delay threshold and the amplitude difference is greater than the amplitude difference threshold, it is determined that the two pulses belong to the partial discharge pulses. When the time delay between the two pulses is greater than the time delay threshold and the amplitude difference is less than the amplitude difference threshold, or when the time delay between the two pulses is less than the time delay threshold, it is determined that the two pulses belong to the external interference pulses. The amplitude difference threshold can be preset when the program is programmed by a user.

It is to be noted that although digital filtering and dynamic threshold processing are performed on the near-end signal and the far-end signal subjected to A/D conversion before intercepting the data segments in the above description, this is not mandatory. In fact, the data segments can be directly intercepted without performing the above two steps, as long as a pulse having a large amplitude is selected as the starting signal point when intercepting the data segments accordingly.

Further, in addition to forming the processing unit by using the industrial control computer combined with the software, partial discharge pulses can be discriminated by employing hardware, i.e., processing unit comprising a digital filtering means (optional), dynamic threshold processing means (optional), data segment intercepting means, time delay comparison means, and amplitude comparison means (optional), in which the digital filtering means performs the above digital filtering operation, the dynamic threshold processing means performs the above dynamic value processing operation, the data segment intercepting means performs the above operations for selecting the starting signal point and intercepting the data segments, and the time delay comparison means determines the two pulses for time delay comparison as described above and discriminates the partial discharge pulses by employing the preset time delay threshold in the above manner. In the case that the amplitude discrimination operation is additionally performed, the amplitude discrimination means performs the above-described amplitude discrimination operation.

Figure 7:
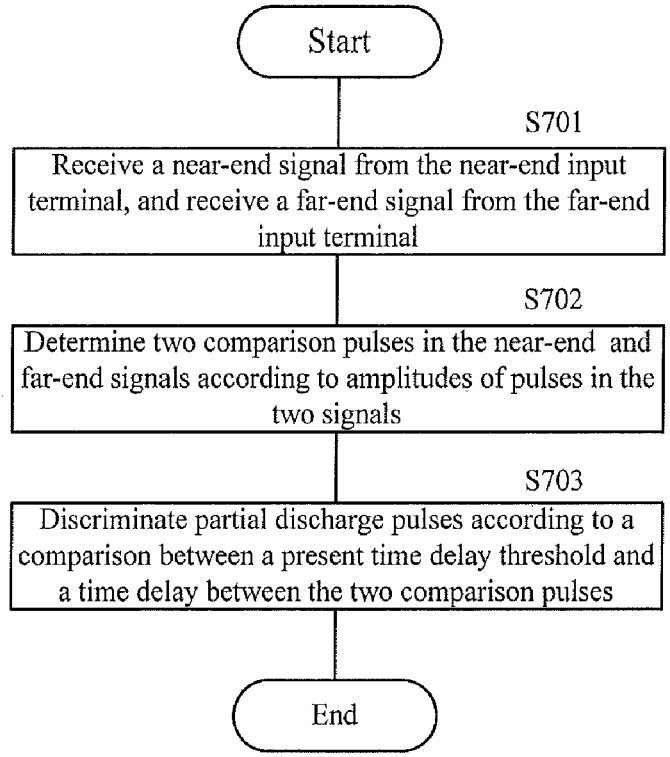
FIG. 7 shows a flow diagram for a method for online monitoring partial discharge pulses according to the present invention.

A method for monitoring partial discharge pulses according to the present invention will be described below with reference to FIG. 7. Referring to FIG. 7, in step 701, the detection device 105 receives a near-end signal sequence from the near-end input terminal, and receives a far-end signal sequence from the far-end input terminal In step S702, the detection device 105 selects one pulse from each of the near-end signal sequence and the far-end signal sequence as a first comparison pulse and a second comparison pulse according to amplitudes of pulses in the near-end and far-end signal sequences. In step S703, the detection device 105 discriminates the partial discharge pulses according to a comparison between a preset time delay threshold $\Delta t_0$ and a time delay between the first comparison pulse and the second comparison pulse.

Figure 8:
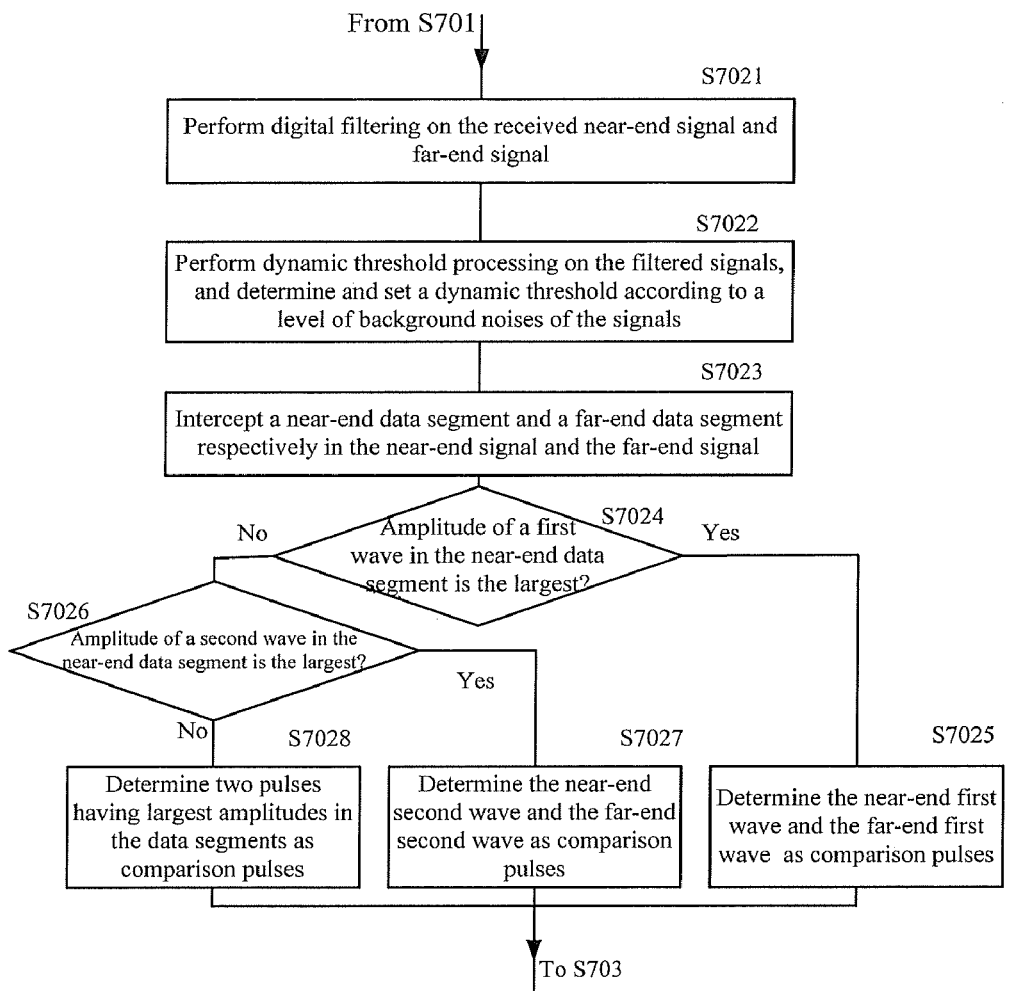
FIG. 8 shows details of step S702 shown in FIG. 7.

FIG. 8 further shows details of step S702. As shown in FIG. 8, in step S7021, digital filtering is performed on the received near-end and far-end signal sequences by the signal conditioning unit 1051 to filter out low-frequency interferences. Next, in step S7022, dynamic threshold processing is performed on the filtered signal sequences by the processing unit 1053 to determine and set a dynamic threshold, so as to filter out signals whose amplitudes are smaller than the dynamic threshold. Then, in step S7023, a first pulse whose amplitude is greater than the dynamic threshold is found in the near-end signal sequence, a segment of data (near-end data segment) is intercepted afterwards by using the first pulse as a starting signal point in the near-end signal sequence, and a segment of data (far-end data segment) having the same length as the near-end data segment is intercepted afterwards from the time which is the same as the starting signal point in the far-end signal sequence. Then, in step S7024, the processing unit 1053 judges whether an amplitude of a first wave in the near-end data segment is the largest. If so, the near-end first wave and a first wave in the far-end data segment (a far-end first wave) are selected as pulses for time delay comparison in step S7025. On the other hand, if it is not, it is judged whether amplitude of a second wave in the near-end data segment is the largest in step S7026. If so, the near-end second wave and a second wave in the far-end data segment (a far-end second wave) are selected as the comparison pulses in step S7027. On the other hand, if it is not, one pulse having the largest amplitude in the near-end data segment and one pulse having the largest amplitude in the far-end data segment are selected as the comparison pulses in step S7028. It is to be noted that steps S7021 and S7022 are performed to enable to better suppress interference pulses and preserve discharge pulses, and at the same time reduce an amount of data to be processed at the same time. According to actual situations in a monitoring site, the two steps are optional, and it is possible to directly intercept the near-end data segment and the far-end data segment from the near-end signal sequence and the far-end signal sequence subjected to the A/D conversion without performing the two steps.

Figure 9:
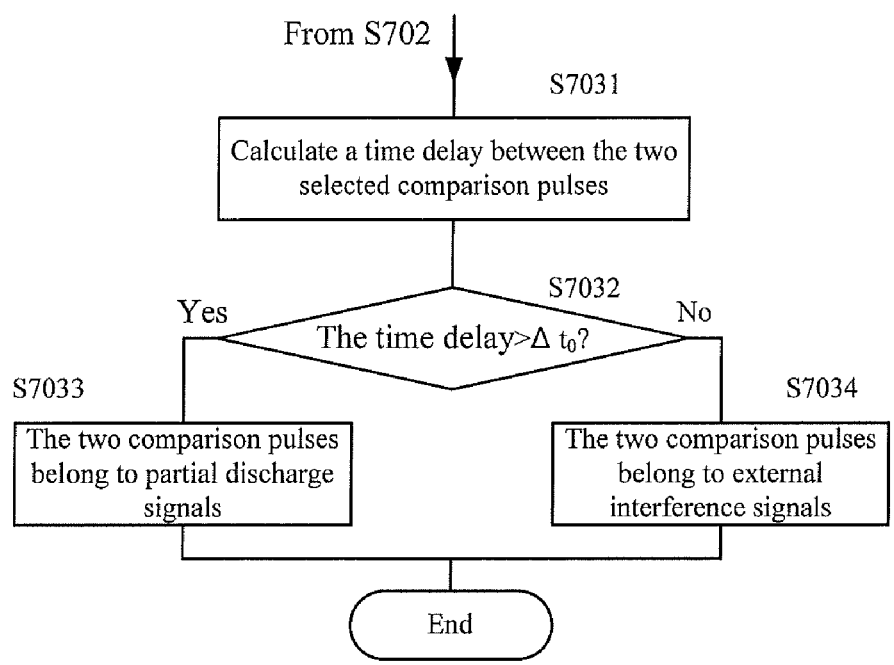
FIG. 9 shows details of step S703 shown in FIG. 7.

FIG. 9 further shows details of step S703. As shown in FIG. 9, in step S7031, the processing unit 1053 calculates a time delay between the times to which the two selected comparison pulses correspond (i.e., the times at which the two comparison pulses arrive at the detection device 105). Next, in step S7032, the time delay is compared with the preset time delay threshold $\Delta t_0$ to determine whether the time delay is greater than $\Delta t_0$. If so, it is determined in step S7033 that the two pulses belong to the partial discharge pulses, whereas if it is not, it is determined in step S7034 that the two pulses belong to the external interference pulses. Then, the discrimination process is terminated.

Figure 10:
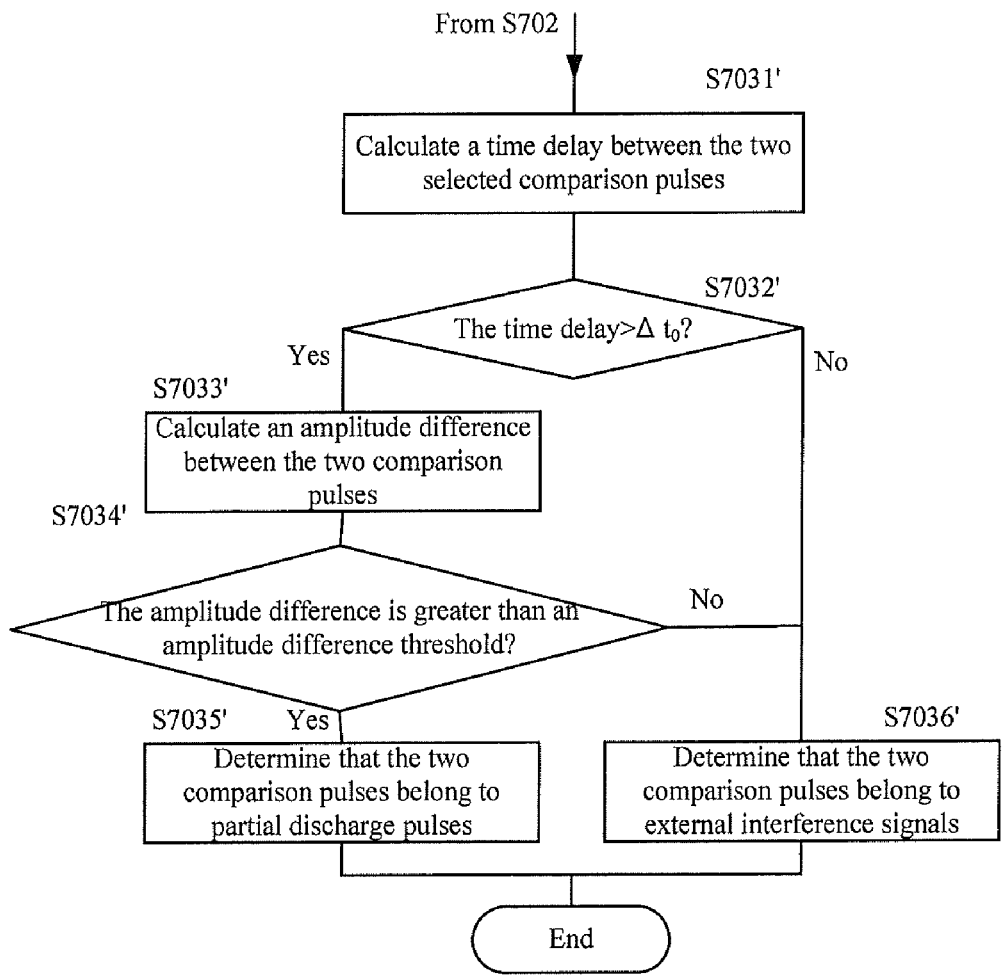
FIG. 10 shows details of step S703 shown in FIG. 7.

Alternatively, in step S703, a flow as shown in FIG. 10 may be adopted to discriminate the partial discharge pulses. Step S7031' and step S7032' in FIG. 10 are the same as step S7031 and step S7032 described above, thus description thereof is omitted. If the time delay is greater than $\Delta t_0$, an amplitude difference of the two comparison pulses is calculated in step S7033', and it is determined in step S7034' whether the amplitude difference is greater than the preset amplitude difference threshold. If the amplitude difference is greater than the preset amplitude difference threshold, it is determined in step S7035' that the two comparison pulses belong to the partial discharge pulses, otherwise it is determined in step S7036' that the two comparison pulses belong to the external interference pulses. On the other hand, if it is determined in step S7032' that the time delay is not greater than the preset time delay threshold $\Delta t_0$, the process directly proceeds to step S7036' and it is determined that the two comparison pulses belong to the external interference pulses. Then, the discrimination process is terminated.

Results of verifying the system and method for online monitoring partial discharge according to the present invention are given below.

1. Laboratory Verification (1) Correction Pulse Test

A capacitor of 0.22 µF is selected to simulate inlet equivalent capacitance of the generator, and a copper wire is used to simulate a busbar of an outlet terminal per phase of the generator. The test is performed by adopting the simulation wiring as shown in FIG. 11.

Figure 11:
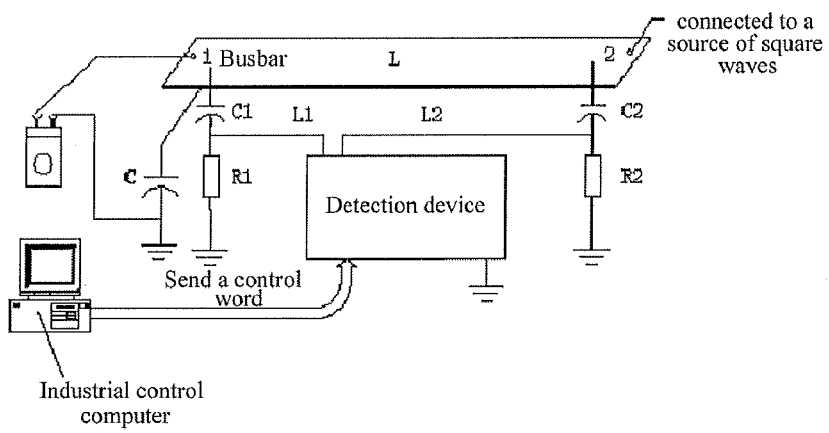
FIG. 11 is a wiring diagram for a correction pulse test.

In FIG. 11, the capacitor C of 0.22 µF is used to simulate the inlet capacitance of one phase of the generator, C1 and C2 are high voltage coupling capacitors, R1 and R2 are detection impedors of 100Ω, and each of two coaxial shielded cables is introduced into the detection device from one end of the respective detection impedor. Correction square waves (with a rising edge of 60 ns and a frequency of 100 Hz) are respectively injected from a port 1 and a port 2, so as to simulate the partial discharge pulses from internal of the generator and the external interference pulses from the electric system respectively. A length L of the copper wire between the two capacitors $C_1$ and $C_2$ and lengths $L_1$ and $L_2$ from the detection impedors to input terminals of the detection device are adjusted so that two signals of the correction pulses injected from the port 2 may arrive at the detection device almost at the same time (the time difference is less than 10 ns), whereas the difference between the times at which two signals of the correction pulses injected in from the port 1 arrive at the detection device is approximately 60 ns (waveforms thereof are substantially consistent with each other).

The results of the test are as follows.

Figure 12:
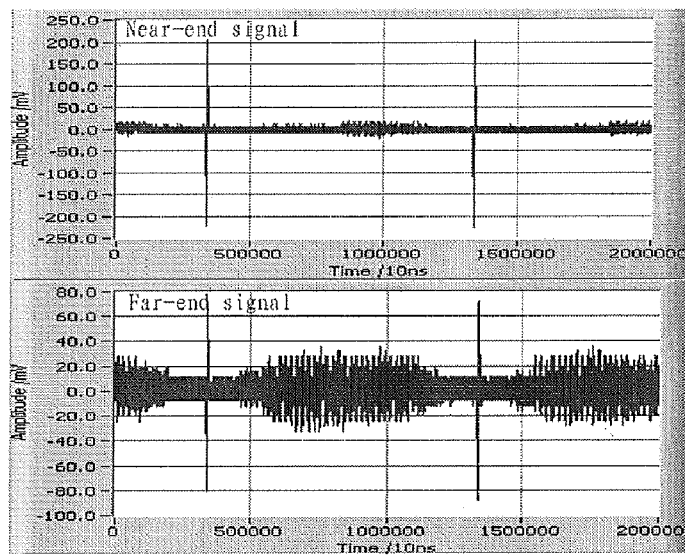
FIG. 12 is measurement spectrums when a square wave is used to simulate partial discharge pulses in the correction pulse test, in which a) is signal spectrums at a near end and a far end in a single power frequency period, b) is analysis spectrums of unfolded single pulse waveforms, and c) is an effect spectrum after pulse time delay discrimination.
Figure 12:
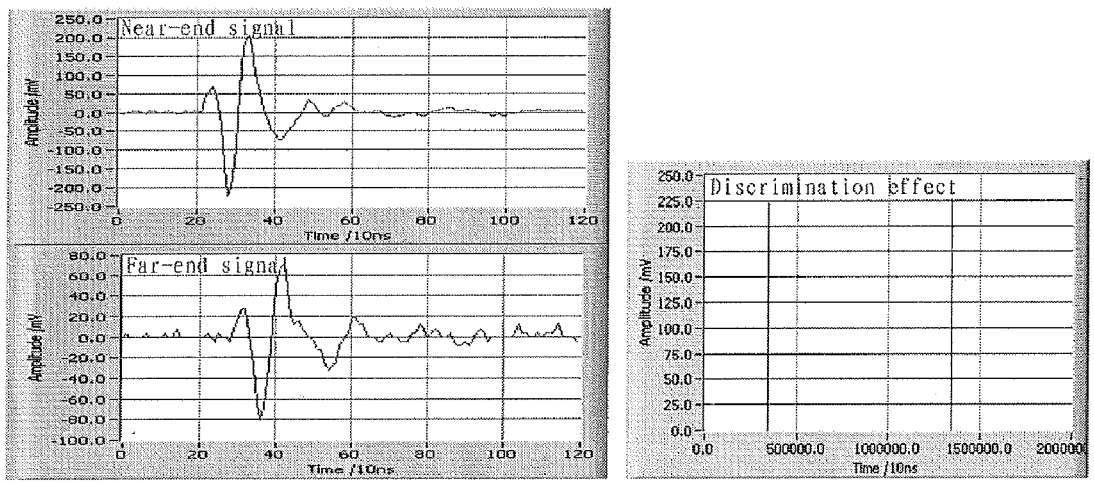

FIG. 12: a square wave (100 Hz) is injected at the port 1 (near end)—the square wave simulates the partial discharge pulses.

Figure 13:
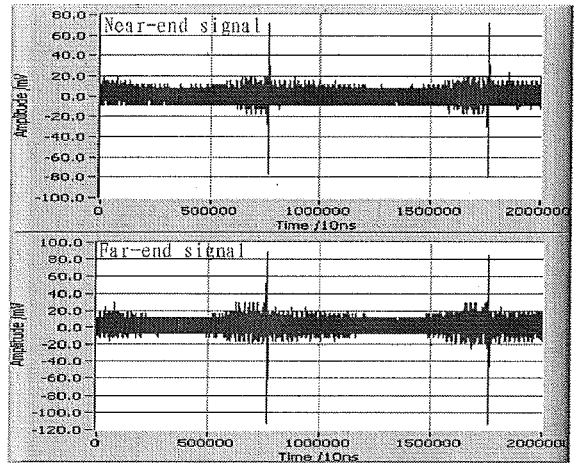
FIG. 13 is measurement spectrums when a square wave is used to simulate external interference pulses in the correction pulse test, in which a) is signal spectrums at a near end and a far end in a single power frequency period, b) is analysis spectrums of unfolded single pulse waveforms, and c) is an effect spectrum after pulse time delay discrimination.
Figure 13:
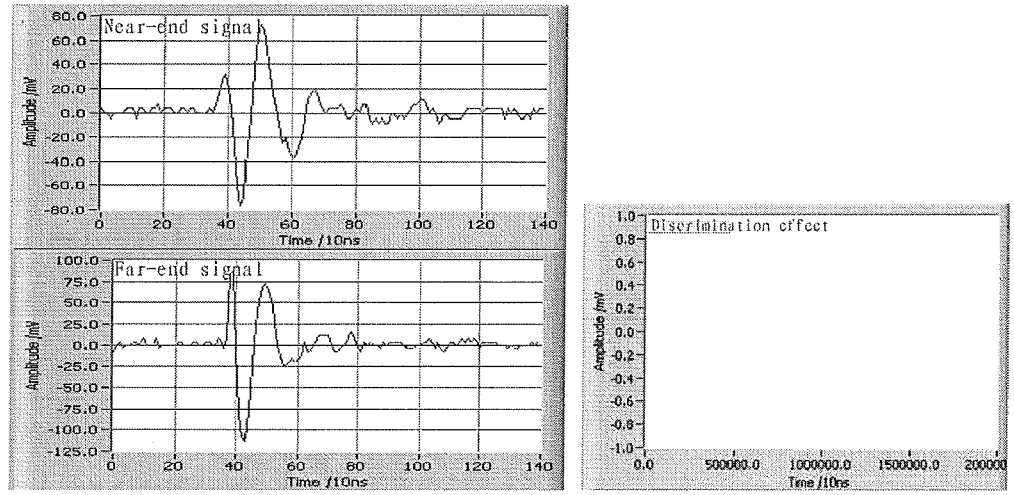

FIG. 13: a square wave (100 Hz) is input at the port 2 (far end)—the square wave simulates the external interference pulses.

The measured waveforms shown in FIGS. 12 and 13 show that the monitoring system of the present invention can effectively eliminate pulse interferences introduced from a busbar, which originate from an external electric system, and meanwhile can effectively capture partial discharge pulses inside the generator. Also, it can be seen that the amplitude of the pulse input from the near-end input terminal is approximately three times of the amplitude of the pulse input from the far-end input terminal when the square wave is injected at the port 1 (near end), and the amplitudes of the pulses input from the near-end input terminal and the far-end input terminal are close when the square wave is injected from the port 2 (far end).

(2) Actual Discharge Source Test

Figure 14:
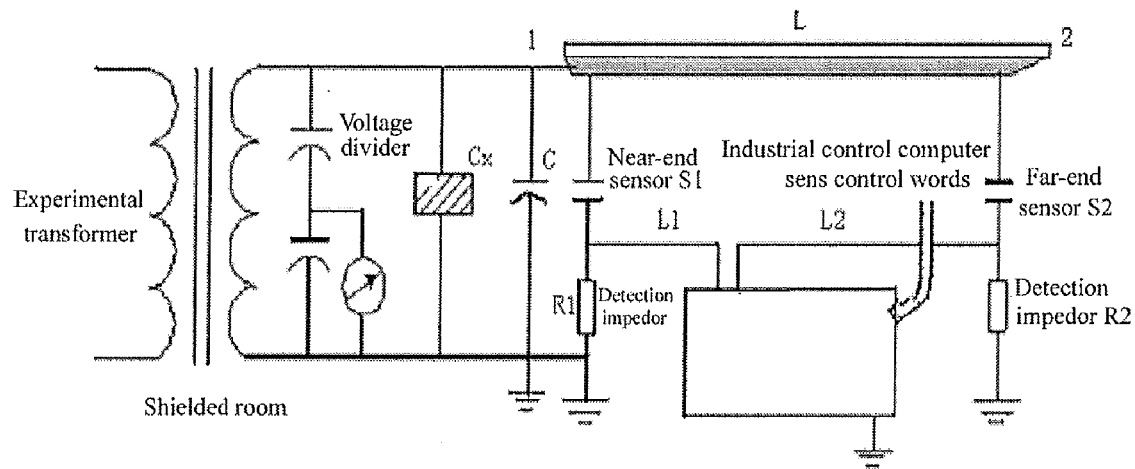
FIG. 14 is a wiring diagram for an actual discharge source test.

In order to further verify feasibility of the system and method of the present invention, an actual discharge source is adopted in our laboratory to test anti-interference effects of the system. The experimental wiring is as shown in FIG. 14, in which C is 0.22 µF and is used for simulating inlet capacitance of one phase of the generator, and $C_x$ is a generator bar with surface discharge.

When the discharge source $C_x$ is connect to end 1, it simulates insulation partial discharge of a stator of the generator, and when the discharge source $C_x$ is arranged at end 2, it simulates random pulse interferences of an external system. The interferences are removed according to the time delay between the times at which two signals arrive at the detection device and the amplitude difference thereof, and the partial discharge signal is extracted. The measurement results when simulating the external interferences are shown in FIG. 15, and the measurement results when simulating the partial discharge of the generator are shown in FIG. 16.

Figure 15:
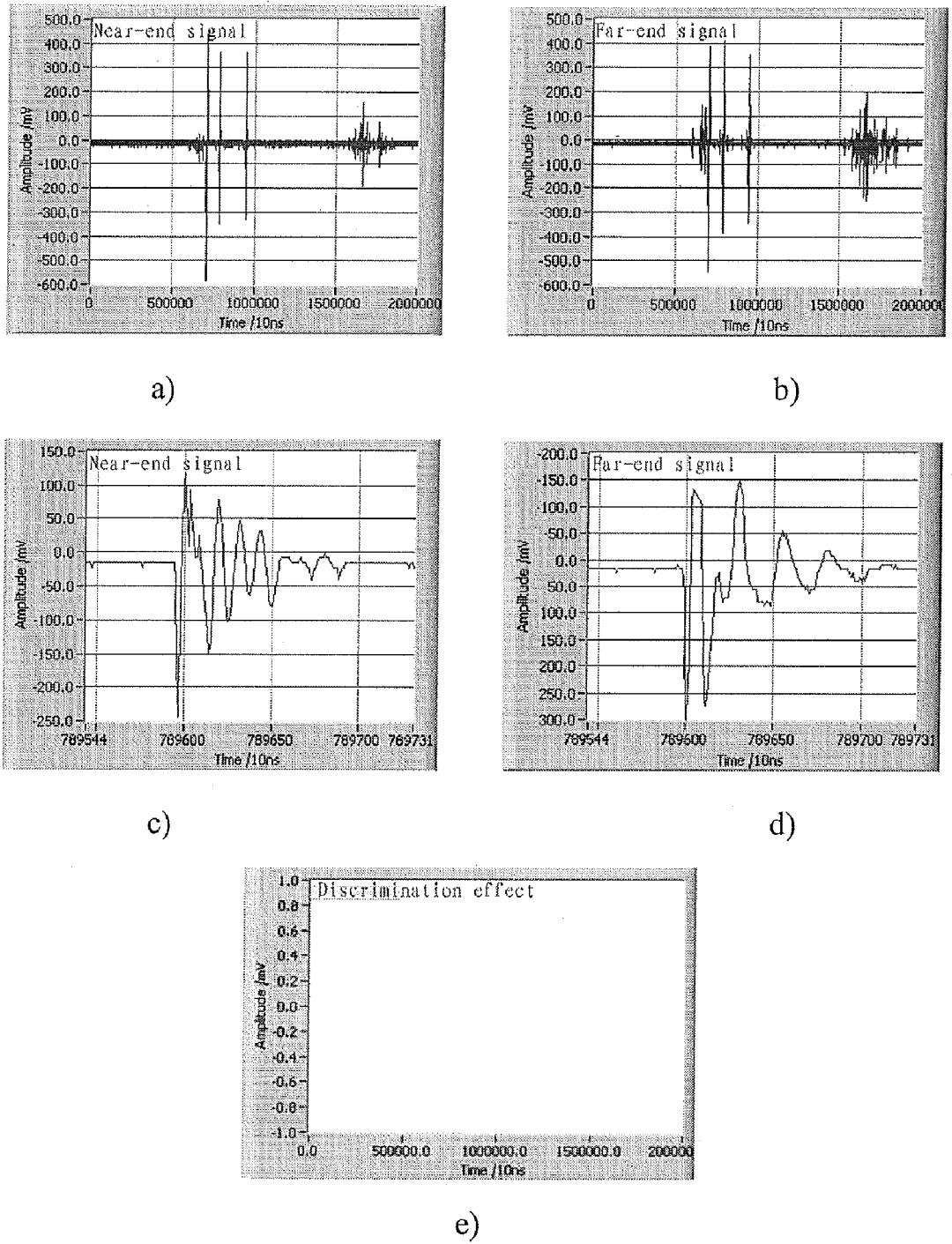
FIG. 15 is an effect diagram when a bar of a generator is used to simulate external interferences in the test for the actual discharge source, in which a) shows a near-end signal in a single power frequency period, b) shows a far-end signal in a single power frequency period, c) is a waveform diagram of a single pulse of the near-end signal, d) is a waveform diagram of a single pulse of the far-end signal, and e) is an effect diagram of pulse time delay discrimination for a single power frequency period.

It can be seen from FIG. 15 that when the discharge source is located at end 2 (far end), a diagram of a single power-frequency period acquired from the near-end input terminal and the far-end input terminal shows that amplitudes of analog interference pulses coupled by the near-end sensor are generally smaller than amplitudes of analog interference pulses which are coupled by the far-end sensor and input from the input terminal. From a waveform diagram of a single pulse obtained by unfolding an extracted pair of pulses in time domain, it can be seen that the pulses acquired from the near-end input terminal and the far-end input terminal arrive almost at the same time. From the above-described judgment of time delay, the pulses belong to the external interference pulses, and thus can be effectively removed.

Figure 16:
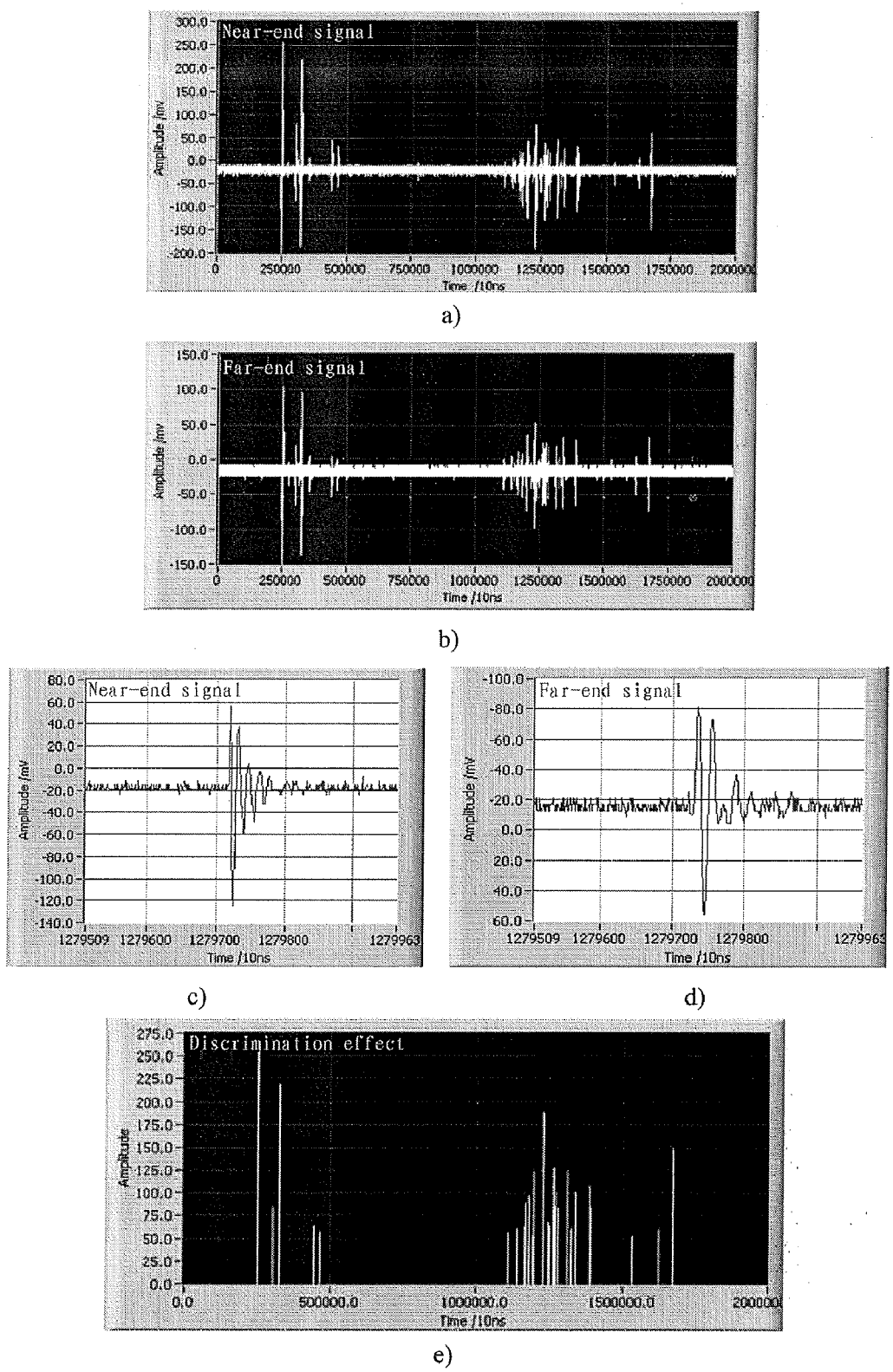
FIG. 16 is an effect diagram when a bar of a generator is used to simulate partial discharge in the test for the actual discharge source, in which a) shows a near-end signal in a single power frequency period, b) shows a far-end signal in a single power frequency period, c) is a waveform diagram of a single pulse of the near-end signal, d) is a waveform diagram of a single pulse of the far-end signal, and e) is an effect diagram of pulse time delay discrimination for a single power frequency period.

In FIG. 16, when the discharge source is located at end 1 (near end) to simulate partial discharge of the generator, a diagram of a single power-frequency period shows that amplitudes of pulses input from the near-end input terminal are generally greater than amplitudes of pulses input from the far-end input terminal. It can be clearly seen from a waveform diagram of a single pulse that there is a large time delay between the pulse acquired from the near-end input terminal and that acquired at the far-end input terminal. From the above-described judgment of time delay, the partial discharge signals can be effectively preserved.

2. Site Verification (1) Correction Pulse Test

Figure 17:
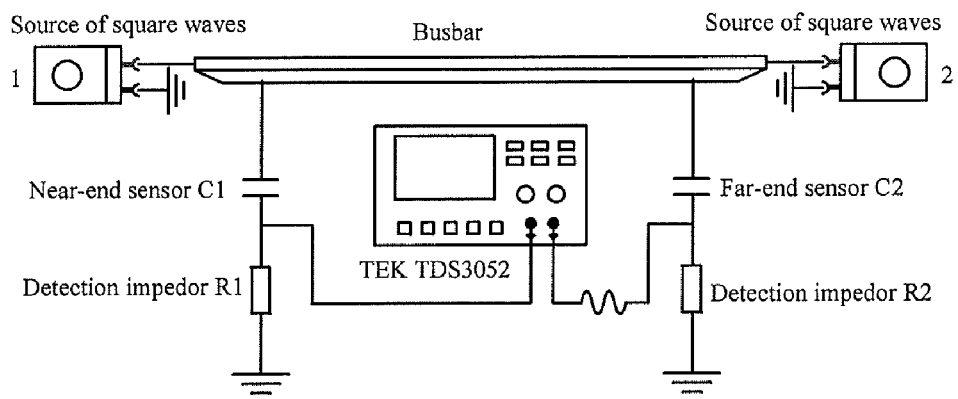
FIG. 17 is a wiring diagram for a site test of correction pulses.

As shown in FIG. 17, pulse square waves are injected from a port 1 (near end) and a port 2 (far end) respectively, two signals respectively input via the near-end input terminal and the far-end input terminal are observed by an oscilloscope, and a time delay between the times at which pulses in the two signals arrive at the detection device is calculated. By adjusting lengths of the near-end and far-end cables, the time delay between the time at which the correction pulses arrive at the detection device via the far-end cable and the time at which the correction pulses arrive at the detection device via the busbar and the near-end cable is rendered to be less than 10 ns when the correction pulses are injected from the port 2 to simulate external interference, and a time delay between the time at which the correction pulses arrive at the detection device via the near-end cable and the time at which the correction pulses arrive at the detection device via the busbar and the far-end cable rendered to be approximately 60 ns when the correction pulses are injected from the port 1 to simulate partial discharge inside the generator, so that requirements for the time delay discrimination are satisfied.

Figure 18:
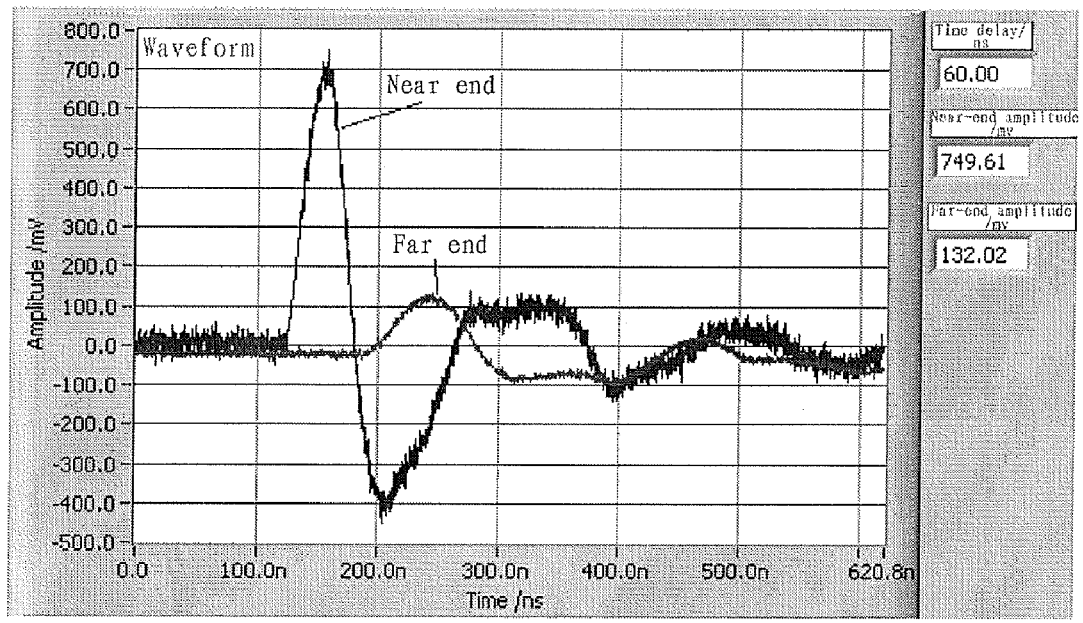
FIG. 18 is an effect diagram of a pulse time delay after a length of a cable is adjusted in the site test of correction pulses, in which a) shows signals obtained by injecting a square wave from a port 1 (near end) after the length of the cable is adjusted, and b) shows signals obtained by injecting a square wave from a port 2 (far end) after the length of the cable is adjusted.
Figure 18:
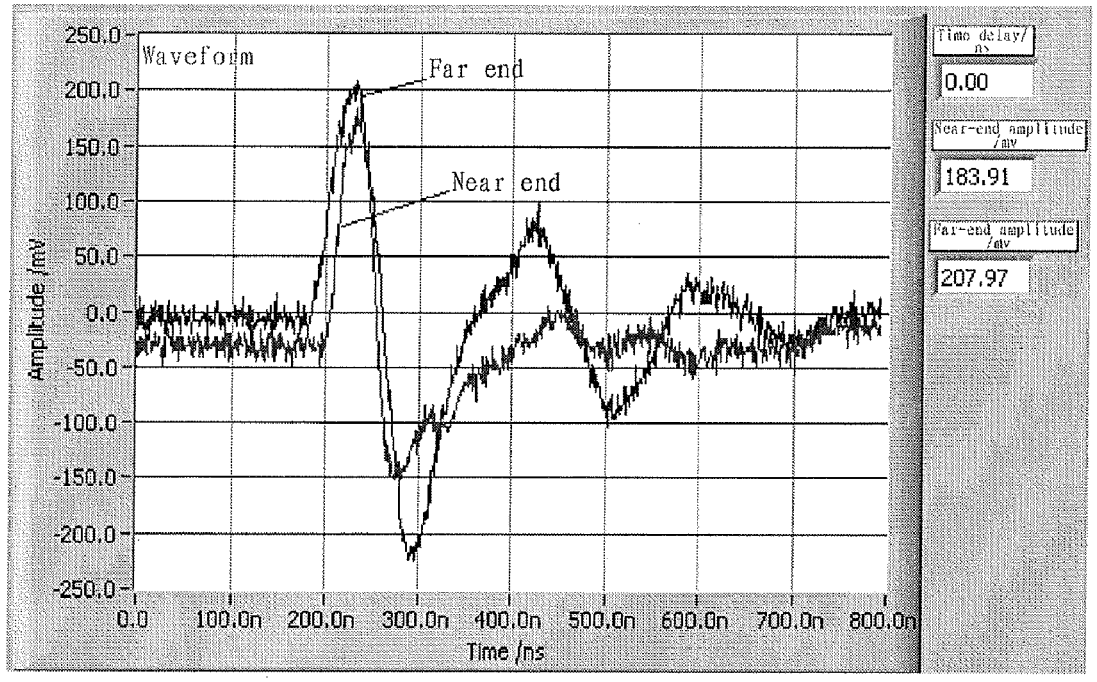

Then, square waves are injected from the port 1 and the port 2 shown in FIG. 17 respectively to verify effects of adjusting the cables. Taking phase C as an example (effects of the other two phases are substantially the same), the measurement results are shown in FIG. 18.

It can be seen from the test results that after the lengths of the cables are adjusted, the time delay between the pulses input from the near-end input terminal and the far-end input terminal satisfies anti-interference condition, the time delay between the times at which two discharge pulses from internal of the generator arrive at the detection device is approximately 60 ns, and the time delay between the times at which two interference pulses from the external electric system arrive at the detection device is less then 10 ns. Interference signals can be eliminated and discharge signals can be preserved through the above discriminations of time delay and amplitude.

(2) Generator Shutdown Test

Figure 19:
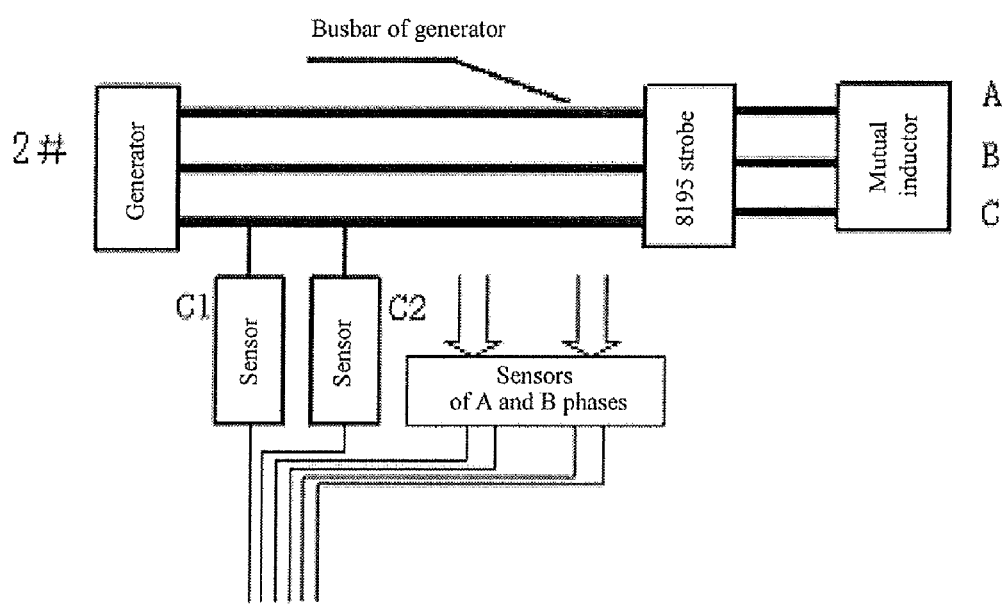
FIG. 19 is a wiring diagram for a generator shutdown site test.
Figure 20:
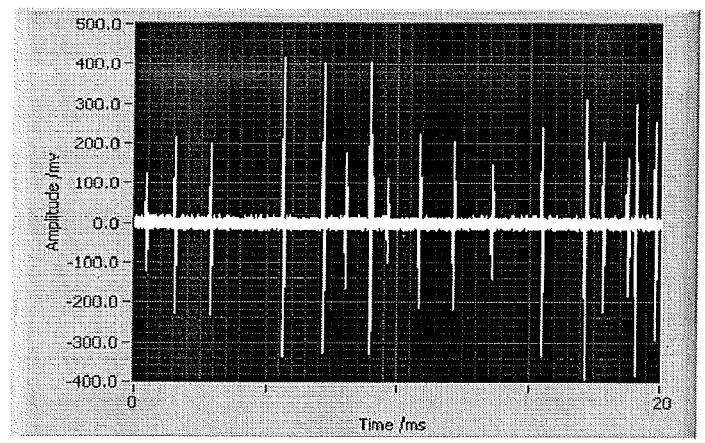
FIG. 20 shows external interference signals measured in the generator shutdown site test, in which a) shows a near-end signal in a single power frequency period; b) shows a far-end signal in a single power frequency period; and c) is an effect diagram of pulse time delay discrimination for a single power frequency period.
Figure 20:
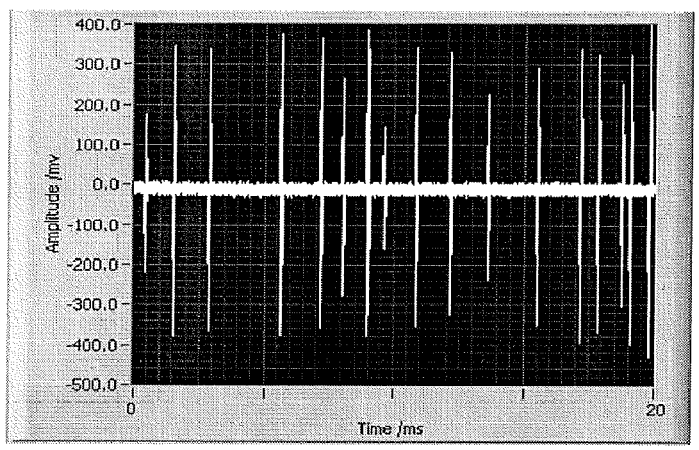
Figure 20:
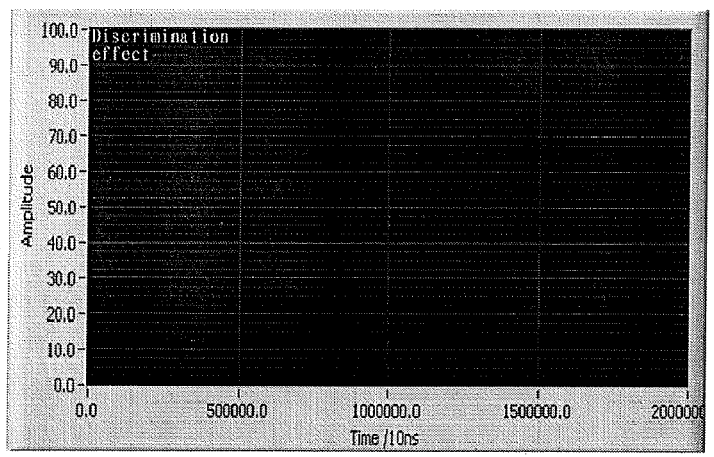

A wiring diagram for the generator shutdown site test is shown in FIG. 19. The generator is not excited, and is not rotated either. There is no voltage in stator windings of the generator at this time, and no partial discharge occurs, but external interferences still exist. At this time, pulses input from the near-end input terminal and the far-end input terminal all belong to external interference pulses, but are all eliminated after the discriminations of time delay and amplitude, as shown in FIG. 20.

As described above, the system and method for online monitoring partial discharge of the generator according to the present invention can effectively eliminate or suppress various interferences from external of the generator and correctly measure partial discharge signals inside the generator, so as to provide an effective reference for evaluating insulation conditions inside the generator.

Although the present invention has been shown and described with reference to the exemplary embodiments thereof, it is to be understood that various modifications in form and details can be made by those skilled in the art to the present invention without departing from the scope and spirit of the present invention as defined in the following claims.

What is claimed is:

1. A system for online monitoring partial discharge, which is connected in parallel with a busbar between a generator and an electric network, comprising:
a near-end circuit on a generator side, which includes a near-end capacitive coupling sensor connected to the busbar and a near-end impedor connected in series with the near-end capacitive coupling sensor;
a far-end circuit on an electric network side, which includes a far-end capacitive coupling sensor connected to the busbar and a far-end impedor connected in series with the far-end capacitive coupling sensor; and
a detection device, which has a near-end input terminal connected to a connection point between the near-end capacitive coupling sensor and the near-end impedor through a near-end cable, a far-end input terminal connected to a connection point between the far-end capacitive coupling sensor and the far-end impedor through a far-end cable, and a processing unit,
wherein a length L of the busbar between the two capacitive coupling sensors, a length L1 of the near-end cable, and a length L2 of the far-end cable satisfy $$\frac{L}{V_b} + \frac{L_1}{V_c} = \frac{L_2}{V_c},$$

in which $V_b$ is a transmission speed of a signal in the busbar and $V_c$ is a transmission speed of a signal in the cables, and the processing unit selects one pulse from each of a near-end signal input from the near-end input terminal and a far-end signal input from the far-end input terminal as a first comparison pulse and a second comparison pulse, and discriminates a partial discharge signal according to a comparison between a preset time delay threshold $\Delta t_0$ and a time delay between the first comparison pulse and the second comparison pulse;
wherein the processing unit selects a pulse having the largest amplitude in the near-end signal as the first comparison pulse,
if the first comparison pulse is a first pulse of the near-end signal, the processing unit selects a first pulse of the far-end signal as the second comparison pulse,
if the first comparison pulse is a second pulse of the near-end signal, the processing unit selects a second pulse of the far-end signal as the second comparison pulse,
otherwise, the processing unit selects a pulse having the largest amplitude in the far-end signal as the second comparison pulse.

2. The system for online monitoring partial discharge according to claim 1, wherein L, $L_1$, and $L_2$ further satisfy:

$$\frac{L}{V_b} + \frac{L_2}{V_c} - \frac{L_1}{V_c} > \Delta t_0.$$

3. The system for online monitoring partial discharge according to claim 1, wherein the processing unit calculates a time delay between the first comparison pulse and the second comparison pulse, and
when the time delay is greater than $\Delta t_0$, the processing unit discriminates the first comparison pulse and the second comparison pulse as partial discharge pulses; otherwise, the processing unit discriminates the first comparison pulse and the second comparison pulse as external interference pulses.

4. The system for online monitoring partial discharge according to claim 1, wherein the processing unit calculates a time delay and an amplitude difference between the first comparison pulse and the second comparison pulse, and
when the time delay is greater than $\Delta t_0$ and the amplitude difference is greater than a preset amplitude difference threshold, the processing unit discriminates the first comparison pulse and the second comparison pulse as partial discharge pulses; otherwise, the processing unit discriminates the first comparison pulse and the second comparison pulse as external interference pulses.

5. The system for online monitoring partial discharge according to claim 1, wherein the detection device further comprises:
a signal conditioning unit for processing the near-end signal and the far-end signal received by the detection device to implement selection of different phase sequences and amplification and filtering of the signals.

6. The system for online monitoring partial discharge according to claim 1, wherein the processing unit further filters out pulses having amplitudes smaller than a preset amplitude threshold from the near-end signal and the far-end signal received by the detection device respectively.

7. The system for online monitoring partial discharge according to claim 1, wherein a bandwidth of the detection device ranges from 5 MHz to 100 MHz.

8. A system for online monitoring partial discharge, which is connected in parallel with a busbar between a generator and an electric network, comprising:
   a near-end circuit on a generator side, which includes a near-end capacitive coupling sensor connected to the busbar and a near-end impedor connected in series with the near-end capacitive coupling sensor;
   a far-end circuit on an electric network side, which includes a far-end capacitive coupling sensor connected to the busbar and a far-end impedor connected in series with the far-end capacitive coupling sensor; and
   a detection device, which has a near-end input terminal connected to a connection point between the near-end capacitive coupling sensor and the near-end impedor through a near-end cable, a far-end input terminal connected to a connection point between the far-end capacitive coupling sensor and the far-end impedor through a far-end cable, and a processing unit,
   wherein a length L of the busbar between the two capacitive coupling sensors, a length L1 of the near-end cable, and a length L2 of the far-end cable satisfy $$\frac{L}{V_b} + \frac{L_1}{V_c} = \frac{L_2}{V_c},$$

in which $V_b$ is a transmission speed of a signal in the busbar and $V_c$ is a transmission speed of a signal in the cables, and
   the processing unit selects one pulse from each of a near-end signal input from the near-end input terminal and a far-end signal input from the far-end input terminal as a first comparison pulse and a second comparison pulse, and discriminates a partial discharge signal according to a comparison between a preset time delay threshold $\Delta t_0$ and a time delay between the first comparison pulse and the second comparison pulse;
      wherein the processing unit selects one pulse having the largest amplitude from each of the near-end signal and the far-end signal as the first comparison pulse and the second comparison pulse.

9. The system for online monitoring partial discharge according to claim 8, wherein L, $L_1$, and $L_2$ further satisfy:

$$\frac{L}{V_b} + \frac{L_2}{V_c} - \frac{L_1}{V_c} > \Delta t_0.$$

10. The system for online monitoring partial discharge according to claim 8, wherein the processing unit calculates a time delay between the first comparison pulse and the second comparison pulse, and
   when the time delay is greater than $\Delta t_0$, the processing unit discriminates the first comparison pulse and the second comparison pulse as partial discharge pulses; otherwise, the processing unit discriminates the first comparison pulse and the second comparison pulse as external interference pulses.

11. The system for online monitoring partial discharge according to claim 8, wherein the processing unit calculates a time delay and an amplitude difference between the first comparison pulse and the second comparison pulse, and
   when the time delay is greater than $\Delta t_0$ and the amplitude difference is greater than a preset amplitude difference threshold, the processing unit discriminates the first comparison pulse and the second comparison pulse as partial discharge pulses; otherwise, the processing unit discriminates the first comparison pulse and the second comparison pulse as external interference pulses.

12. The system for online monitoring partial discharge according to claim 8, wherein the detection device further comprises:
   a signal conditioning unit for processing the near-end signal and the far-end signal received by the detection device to implement selection of different phase sequences and amplification and filtering of the signals.

13. The system for online monitoring partial discharge according to claim 8, wherein the processing unit further filters out pulses having amplitudes smaller than a preset amplitude threshold from the near-end signal and the far-end signal received by the detection device respectively.

14. The system for online monitoring partial discharge according to claim 8, wherein a bandwidth of the detection device ranges from 5 MHz to 100 MHz.

15. A method for online monitoring partial discharge, which is used in a system for monitoring partial discharge, the system for monitoring partial discharge being connected in parallel with a busbar between a generator and an electric network and comprising: a near-end circuit on a generator side, which includes a near-end capacitive coupling sensor connected to the busbar and a near-end impedor connected in series with the near-end capacitive coupling sensor; a far-end circuit on an electric network side, which includes a far-end capacitive coupling sensor connected to the busbar and a far-end impedor connected in series with the far-end capacitive coupling sensor; and a detection device, which has a near-end input terminal connected to a connection point between the near-end capacitive coupling sensor and the near-end impedor through a near-end cable, and a far-end input terminal connected to a connection point between the far-end capacitive coupling sensor and the far-end impedor through a far-end cable, wherein a length L of the busbar between the two capacitive coupling sensors, a length L1 of the near-end cable, and a length L2 of the far-end cable satisfy $$\frac{L}{V_b} + \frac{L_1}{V_c} = \frac{L_2}{V_c},$$

in which $V_b$ is a transmission speed of a signal in the busbar and $V_c$ is a transmission speed of a signal in the cables, the method comprising:
   a receiving step for receiving a near-end signal from the near-end input terminal and receiving a far-end signal from the far-end input terminal;
   a selecting step for selecting one pulse from each of the near-end signal and the far-end signal as a first comparison pulse and a second comparison pulse; and
   a discriminating step for discriminating partial discharge pulses according to a comparison between a preset time delay threshold $\Delta t_0$ and a time delay between the first comparison pulse and the second comparison pulse,
      wherein in the selecting step, a pulse having the largest amplitude in the near-end signal is selected as the first comparison pulse, if the first comparison pulse is a first pulse of the near-end signal, a first pulse of the far-end signal is selected as the second comparison pulse, if the first comparison pulse is a second pulse of the near-end signal, a second pulse of the far-end signal is selected as the second comparison pulse, otherwise, a pulse having the largest amplitude in the far-end signal is selected as the second comparison pulse.

16. The method for online monitoring partial discharge according to claim 15, wherein L, $L_1$, and $L_2$ further satisfy:

$$\frac{L}{V_b} + \frac{L_2}{V_c} - \frac{L_1}{V_c} > \Delta t_0.$$

17. The method for online monitoring partial discharge according to claim 15, wherein the discriminating step comprises:
calculating a time delay between the first comparison pulse and the second comparison pulse, and
discriminating the first comparison pulse and the second comparison pulse as partial discharge pulses when the time delay is greater than $\Delta t_0$, otherwise discriminating the first comparison pulse and the second comparison pulse as external interference pulses.

18. The method for online monitoring partial discharge according to claim 15, wherein the discriminating step comprises:
calculating a time delay and an amplitude difference between the first comparison pulse and the second comparison pulse, and
discriminating the first comparison pulse and the second comparison pulse as partial discharge pulses when the time delay is greater than $\Delta t_0$ and the amplitude difference is greater than a preset amplitude difference threshold, otherwise discriminating the first comparison pulse and the second comparison pulse as external interference pulses.

19. A method for online monitoring partial discharge, which is used in a system for monitoring partial discharge, the system for monitoring partial discharge being connected in parallel with a busbar between a generator and an electric network and comprising: a near-end circuit on a generator side, which includes a near-end capacitive coupling sensor connected to the busbar and a near-end impedor connected in series with the near-end capacitive coupling sensor; a far-end circuit on an electric network side, which includes a far-end capacitive coupling sensor connected to the busbar and a far-end impedor connected in series with the far-end capacitive coupling sensor; and a detection device, which has a near-end input terminal connected to a connection point between the near-end capacitive coupling sensor and the near-end impedor through a near-end cable, and a far-end input terminal connected to a connection point between the far-end capacitive coupling sensor and the far-end impedor through a far-end cable, wherein a length L of the busbar between the two capacitive coupling sensors, a length L1 of the near-end cable, and a length L2 of the far-end cable satisfy $$\frac{L}{V_b} + \frac{L_1}{V_c} = \frac{L_2}{V_c},$$

in which $V_b$ is a transmission speed of a signal in the busbar and $V_c$ is a transmission speed of a signal in the cables, the method compressing:
a receiving step for receiving a near-end signal from the near-end input terminal and receiving a far-end signal from the far-end input terminal;
a selecting step for selecting one pulse from each of the near-end signal and the far-end signal as a first comparison pulse and a second comparison pulse; and
a discriminating step for discriminating partial discharge pulses according to a comparison between a preset time delay threshold $\Delta t_0$ and a time delay between the first comparison pulse and the second comparison pulse,
wherein in the selecting step, pulses having the largest amplitude in the near-end signal and the far-end signal are respectively selected as the first comparison pulse and the second comparison pulse.

20. The method for online monitoring partial discharge according to claim 19, wherein L, $L_1$, and $L_2$ further satisfy:

$$\frac{L}{V_b} + \frac{L_2}{V_c} - \frac{L_1}{V_c} > \Delta t_0.$$

21. The method for online monitoring partial discharge according to claim 19, wherein the discriminating step comprises:
calculating a time delay between the first comparison pulse and the second comparison pulse, and
discriminating the first comparison pulse and the second comparison pulse as partial discharge pulses when the time delay is greater than $\Delta t_0$, otherwise discriminating the first comparison pulse and the second comparison pulse as external interference pulses.

22. The method for online monitoring partial discharge according to claim 19, wherein the discriminating step comprises:
calculating a time delay and an amplitude difference between the first comparison pulse and the second comparison pulse, and
discriminating the first comparison pulse and the second comparison pulse as partial discharge pulses when the time delay is greater than $\Delta t_0$ and the amplitude difference is greater than a preset amplitude difference threshold, otherwise discriminating the first comparison pulse and the second comparison pulse as external interference pulses.

* * * * *

UNITED STATES PATENT AND TRADEMARK OFFICE
CERTIFICATE OF CORRECTION

PATENT NO. : 8,271,213 B2  
APPLICATION NO. : 12/667517  
DATED : September 18, 2012  
INVENTOR(S) : Xu et al.

Page 1 of 1

It is certified that error appears in the above-identified patent and that said Letters Patent is hereby corrected as shown below:

Title Page, Item "(73) Assignees:"  
please change "Guangzhou, Guangdong Province" to --Xi'an, Shaanxi Province--

Title Page, Item (56) "OTHER PUBLICATIONS"  
please change "PCT/CN20081001167" to --PCT/CN2008/001167--

Signed and Sealed this  
Twelfth Day of March, 2013

Teresa Stanek Rea  
*Acting Director of the United States Patent and Trademark Office*